United States Patent
Hwang et al.

(10) Patent No.: US 12,261,106 B2
(45) Date of Patent: Mar. 25, 2025

(54) SEMICONDUCTOR PACKAGE

(71) Applicant: Samsung Electronics Co., Ltd., Suwon-si (KR)

(72) Inventors: Hyeonjeong Hwang, Cheonan-si (KR); Kyoung Lim Suk, Suwon-si (KR); Seokhyun Lee, Hwaseong-si (KR); Jaegwon Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 575 days.

(21) Appl. No.: 17/535,093

(22) Filed: Nov. 24, 2021

(65) Prior Publication Data

US 2022/0328389 A1    Oct. 13, 2022

(30) Foreign Application Priority Data

Apr. 8, 2021    (KR) .................. 10-2021-0046062

(51) Int. Cl.
*H01L 23/48*     (2006.01)
*H01L 23/00*     (2006.01)
(Continued)

(52) U.S. Cl.
CPC .... *H01L 23/49822* (2013.01); *H01L 23/3128* (2013.01); *H01L 23/49816* (2013.01);
(Continued)

(58) Field of Classification Search
CPC ........... H01L 23/49833; H01L 23/5389; H01L 23/5226; H01L 2924/15174; H01L 25/0657
(Continued)

(56) References Cited

U.S. PATENT DOCUMENTS

| | | | | |
|---|---|---|---|---|
| 7,696,613 B2 * | 4/2010 | Nakamura | ........ | H01L 23/49822 |
| | | | | 257/776 |
| 8,304,880 B2 * | 11/2012 | Chow | ................... | H01L 25/105 |
| | | | | 438/109 |
| 8,929,090 B2 * | 1/2015 | Nakashima | ....... | H01L 23/49838 |
| | | | | 361/764 |

(Continued)

FOREIGN PATENT DOCUMENTS

| | | |
|---|---|---|
| JP | 5111342 B2 | 1/2013 |
| KR | 1020200137220 A | 12/2020 |

*Primary Examiner* — Nitin Parekh
(74) *Attorney, Agent, or Firm* — Muir Patent Law, PLLC

(57) ABSTRACT

A semiconductor package comprises a first redistribution substrate including first interconnection layers sequentially stacked on each other, a semiconductor chip mounted on the first redistribution substrate, a mold layer disposed on the first redistribution substrate and surrounding the semiconductor chip, a second redistribution substrate disposed on the mold layer and including second interconnection layers sequentially stacked on each other, a connection terminal disposed beside the semiconductor chip to connect the first and second redistribution substrates to each other, and outer terminals disposed on a bottom surface of the first redistribution substrate. Each of the first and second interconnection layers may include an insulating layer and a wire pattern in the insulating layer. The first redistribution substrate may have substantially the same thickness as the second redistribution substrate, and the first interconnection layers may be thinner than the second interconnection layers.

19 Claims, 10 Drawing Sheets

(51) Int. Cl.
*H01L 23/31* (2006.01)
*H01L 23/498* (2006.01)
*H01L 25/065* (2023.01)
*H01L 25/10* (2006.01)

(52) U.S. Cl.
CPC .. *H01L 23/49833* (2013.01); *H01L 23/49838* (2013.01); *H01L 24/16* (2013.01); *H01L 24/32* (2013.01); *H01L 24/73* (2013.01); *H01L 24/20* (2013.01); *H01L 25/0657* (2013.01); *H01L 25/105* (2013.01); *H01L 2224/16227* (2013.01); *H01L 2224/16235* (2013.01); *H01L 2224/211* (2013.01); *H01L 2224/32225* (2013.01); *H01L 2224/73204* (2013.01); *H01L 2924/15174* (2013.01); *H01L 2924/3511* (2013.01)

(58) Field of Classification Search
USPC .................................. 257/700, 686, 758, 774
See application file for complete search history.

(56) References Cited

U.S. PATENT DOCUMENTS

| | | |
|---|---|---|
| 8,980,691 B2 * | 3/2015 | Lin ......................... H01L 25/50 |
| | | 438/666 |
| 9,508,674 B2 | 11/2016 | Pan et al. |
| 9,735,131 B2 * | 8/2017 | Su ........................... H01L 25/50 |
| 10,026,703 B2 | 7/2018 | Lee et al. |
| 10,418,317 B2 | 9/2019 | Lee et al. |
| 10,643,936 B2 | 5/2020 | Hu |
| 10,777,518 B1 * | 9/2020 | Wang ................. H01L 21/4857 |
| 11,676,890 B2 * | 6/2023 | Yu ..................... H01L 23/49833 |
| | | 257/777 |
| 2012/0211885 A1 * | 8/2012 | Choi .................... H01L 25/105 |
| | | 257/737 |
| 2014/0360765 A1 * | 12/2014 | Kiwanami ............. H05K 1/185 |
| | | 174/260 |
| 2015/0187742 A1 * | 7/2015 | Kwon ..................... H01L 24/24 |
| | | 438/126 |
| 2016/0190056 A1 | 6/2016 | Park et al. |
| 2018/0277394 A1 * | 9/2018 | Huemoeller ........ H01L 23/5389 |

\* cited by examiner

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2021-0046062, filed on Apr. 8, 2021, in the Korean Intellectual Property Office, the entire contents of which are herein incorporated by reference.

TECHNICAL FIELD

Embodiments of the present inventive concepts are directed to a semiconductor package, and in particular, to a fan-out semiconductor package.

DISCUSSION OF RELATED ART

As an integration density of semiconductor chips increases, a size of the semiconductor chips is gradually decreasing. However, in the case where the size of a semiconductor chip is reduced, it is more and more difficult to attach many solder balls to the semiconductor chip, and to handle and test the solder balls. In addition, it is helpful to diversify a board in accordance with a size of a semiconductor chip, and this is another difficult problem. To help overcome these problems, a fan-out package has been proposed.

In general, a process of manufacturing a semiconductor package includes steps of mounting a semiconductor chip on a substrate and of encapsulating the resulting structure with a mold layer. In the case where the semiconductor package is manufactured in a flip-chip bonding manner, a soldering process is performed to form solder balls or solder bumps, which electrically connect the semiconductor chip to the substrate, between the substrate and the semiconductor chip. Since the soldering process is a thermal process, the soldering process may cause a warpage issue in the semiconductor chip and in a substrate. This warpage in the semiconductor chip and the substrate may lead to a failure in electrical connection between the semiconductor chip and the substrate.

SUMMARY

Embodiments of the present inventive concepts provide a semiconductor package with improved warpage property.

Embodiments of the present inventive concepts provide a semiconductor package with improved structural stability.

Embodiments of the present inventive concepts provide a method of reducing a failure rate in a process of manufacturing a semiconductor package.

According to some embodiments of the present inventive concepts, a semiconductor package includes a first redistribution substrate including first interconnection layers that are sequentially stacked on each other, a semiconductor chip mounted on the first redistribution substrate, a mold layer disposed on the first redistribution substrate and surrounding the semiconductor chip, a second redistribution substrate disposed on the mold layer, the second redistribution substrate including second interconnection layers that are sequentially stacked on each other, a connection terminal disposed beside the semiconductor chip to connect the first redistribution substrate and the second redistribution substrate to each other, and outer terminals disposed on a bottom surface of the first redistribution substrate. Each of the first interconnection layers may include a first insulating layer and a first wire pattern that is provided in the first insulating layer, and each of the second interconnection layers may include a second insulating layer and a second wire pattern that is provided in the second insulating layer. A thickness of the first redistribution substrate may be substantially equal to a thickness of the second redistribution substrate, and a first thickness of each of the first interconnection layers may be smaller than a second thickness of each of the second interconnection layers.

According to some embodiments of the present inventive concepts, a semiconductor package includes a first redistribution substrate including a number of first interconnection layers that are sequentially stacked on each other, a second redistribution substrate disposed on the first redistribution substrate, the second redistribution substrate including a number of second interconnection layers that are sequentially stacked on each other, a semiconductor chip disposed between the first redistribution substrate and the second redistribution substrate, the second redistribution substrate is mounted on one of the first redistribution substrate and the second redistribution substrate, a mold layer provided between the first redistribution substrate and the second redistribution substrate, the mold layer surrounding the semiconductor chip, and a connection terminal disposed beside the semiconductor chip to connect the first redistribution substrate and the second redistribution substrate to each other. Each interconnection layer of the first and second interconnection layers may include an insulating layer and a wire pattern that is provided in the insulating layer. A thickness of the first redistribution substrate may be substantially equal to a thickness of the second redistribution substrate. The number of the first interconnection layers provided in the first redistribution substrate may be greater than the number of the second interconnection layers provided in the second redistribution substrate.

According to some embodiments of the present inventive concepts, a semiconductor package includes a first redistribution substrate including a number of first interconnection layers that are sequentially stacked on each other, a semiconductor chip mounted on the first redistribution substrate, a second redistribution substrate disposed on the semiconductor chip, the second redistribution substrate including a number of second interconnection layers that are sequentially stacked on each other, and a connection terminal disposed beside the semiconductor chip to connect the first redistribution substrate and the second redistribution substrate to each other. A ratio of a thickness of the first redistribution substrate to a thickness of the second redistribution substrate has a value in a range from 1:1 to 1.3:1. The number of the first interconnection layers provided in the first redistribution substrate is greater than the number of the second interconnection layers provided in the second redistribution substrate. A first thickness of each of the first interconnection layers is smaller than a second thickness of each of the second interconnection layers.

DETAILED DESCRIPTION

Example embodiments of the present inventive concepts will now be described more fully with reference to the accompanying drawings, in which example embodiments are shown.

Figure 1:
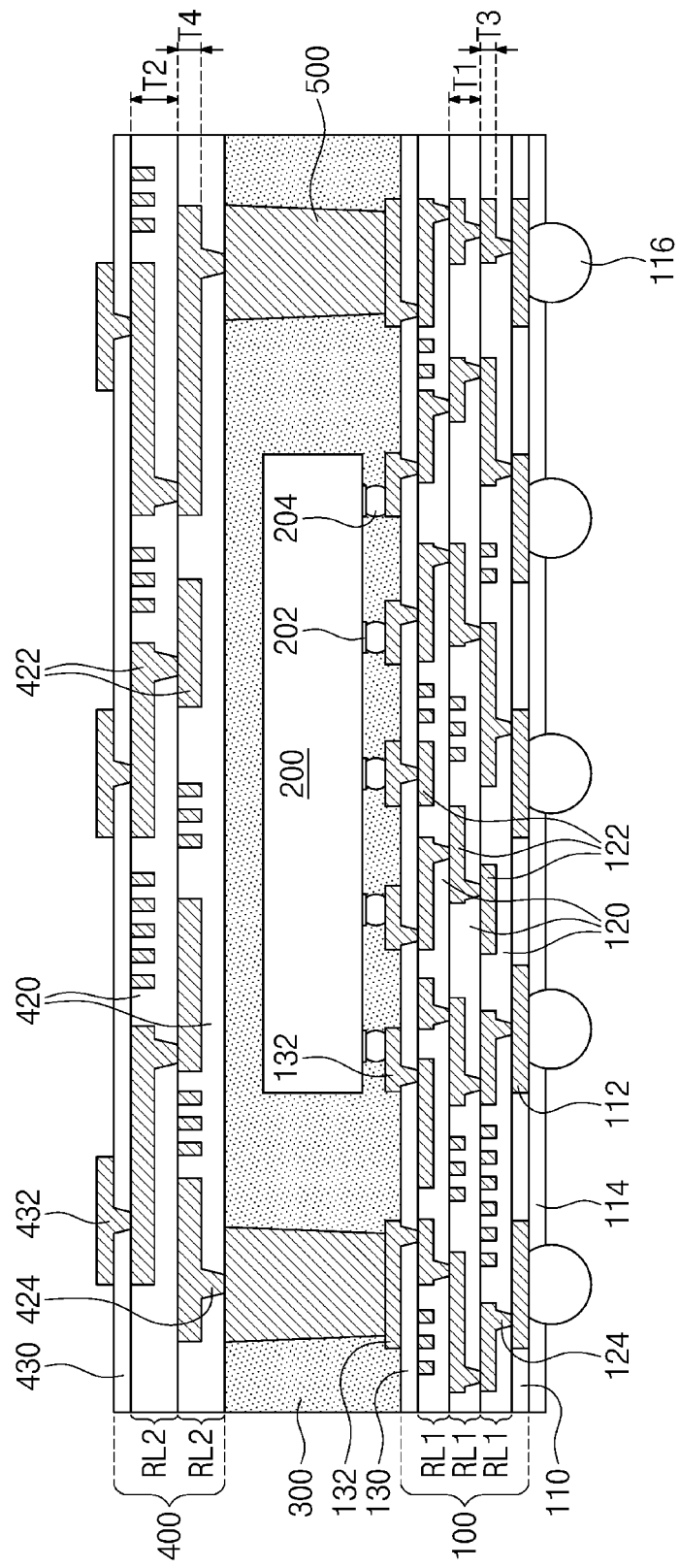
FIGS. 1 to 6 are sectional views of semiconductor packages according to some embodiments of the present inventive concepts.

FIG. 1 is a sectional view of a semiconductor package according to some embodiments of the present inventive concepts.

Referring to FIG. 1, a first redistribution substrate 100 is provided. The first redistribution substrate 100 may include a first insulating pattern 110 and at least two first interconnection layers RL1. For example, the first redistribution substrate 100 may include one or more first interconnection layers RL1 that consist of all of the interconnection layers of the first redistribution substrate 100.

The first insulating pattern 110 may be part of a first layer and may be formed of or include an insulating material. Terms such as "first," "second," "third," etc., may be used herein merely as a naming convention, to different certain components from other components. Items described as "first" in the specification, may be described with a different name (e.g., "second," or "third") in a different portion of the specification or claims. For example, the first insulating pattern 110 may be formed of or include an insulating polymer or a photo-imagable polymer. A first layer that includes the first insulating pattern 110 may include first substrate pads 112, which are electrically connected to the first interconnection layers RL1 provided on the first insulating pattern 110. The first substrate pads 112 may be buried in the first insulating pattern 110, and surrounded by the first insulating pattern 110. The first insulating pattern 110 may have a planar shape, with openings therein, in which the first substrate pads 112 are disposed. The first substrate pads 112 may be exposed to the outside of the first insulating pattern 110 through top and bottom surfaces of the first insulating pattern 110. The first substrate pads 110 may be formed of or may include a conductive material, such as a metal. Although not shown, each first substrate pad 112 may include a seed layer or a barrier layer provided on bottom and side surfaces thereof. In some embodiments, the seed layer or the barrier layer may be provided on only the bottom surfaces of each first substrate pad 112. The first substrate pads 112 may have flat, planar top and bottom surfaces, which may be coplanar with top and bottom surfaces of the first insulating pattern 110. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

A protection layer 114 may be provided on the bottom surface of the first insulating pattern 110. The protection layer 114 may cover the bottom surface of the first insulating pattern 110 and may expose at least part of each pad of the first substrate pads 112. Part of each pad of the first substrate pads 112 may be covered by the protection layer 114. Outer terminals 116 may be provided on the exposed bottom surfaces of the first substrate pads 112. The outer terminals 116, also described as package external terminals, may include conductive material such as solder balls or solder bumps.

The first interconnection layers RL1 may be disposed on the first insulating pattern 110. The first interconnection layers RL1 may be sequentially stacked on the first insulating pattern 110. For example, the first interconnection layers RL1 may be sequentially stacked and directly adjacent to each other to be sequentially stacked on each other. Hereinafter, a structure of the first interconnection layers RL1 will be described in more detail with reference to one of the first interconnection layers RL1.

A first interconnection layer RL1 may include a first insulating layer 120 and a first wire pattern 122.

The first insulating layer 120 may cover the first insulating pattern 110. Alternatively, the first insulating layer 120 of each of the first interconnection layers RL1 may cover another one of the first interconnection layers RL1 thereunder. The first insulating layer 120 may be formed of or include a photo-imagable polymer (e.g., photo-imagable dielectric (PID)). For example, the photo-imagable polymers may include photo-imagable polyimides, polybenzoxazole (PBO), phenol-based polymers, and benzocyclobutene-based polymers. Alternatively, the first insulating layer 120 may be formed of or include an insulating polymer.

The first wire pattern 122 may be provided in the first insulating layer 120. The first wire pattern 122 may extend horizontally in the first insulating layer 120. For example, the first wire pattern 122 may serve as a pad or wire portion of the first interconnection layer RL1. For example, the first wire pattern 122 may be an element, which is used for a horizontal redistribution in the first redistribution substrate 100. The first wire pattern 122 may be provided in an upper portion of the first insulating layer 120. A top surface of the first wire pattern 122 may be exposed to the outside of the first insulating layer 120 near the top surface of the first insulating layer 120. The first wire pattern 122 may be formed of or include at least one of conductive materials. For example, the first wire pattern 122 may be formed of or include copper (Cu).

A first via 124 may be provided below the first wire pattern 122. The first via 124 may be used to vertically connect the first wire patterns 122 of vertically adjacent ones of the first interconnection layers RL1 to each other. In addition, the first via 124 may be used to connect the first wire pattern 122 of the lowermost first interconnection layer RL1 to the first substrate pads 112. For example, the first via 124 may be provided on a portion of a bottom surface of the first wire pattern 122. A bottom surface of the first via 124 may be exposed to the outside of the first insulating layer 120 through the bottom surface of the first insulating layer 120. The first via 124 may extend from the bottom surface of the first wire pattern 122 and may be coupled to (e.g., may contact) the top surface of the first wire pattern 122 of the first interconnection layer RL1 thereunder. In some embodiments, the first via 124 may extend from the bottom surface of the first wire pattern 122 and may be connected to a top surface of the first substrate pad 112. The first via 124 may be formed of or include at least one of conductive materials. For example, the first via 124 may be formed of or include copper (Cu). The first via 124 may also be referred to herein as a first conductive via.

The first wire pattern 122 and the first via 124 may have a damascene structure. For example, each individual first wire pattern 122 and corresponding first via 124 may constitute a single object (e.g., a continuous, integrated object or piece), and in this case, the first wire pattern 122 and the first via 124 may serve as head and tail portions of the single object, respectively. There may be no interface, or grain boundary, between each individual first wire pattern 122 and its corresponding first via 124. Here, a width of the first wire pattern 122 (e.g., horizontal width), which is connected to the first via 124, may be larger than a width of the first via 124. Each individual first wire pattern 122 and corresponding first via 124 may have the shape of letter 'T'. Although a perspective or plan view is not shown, the first vias 124 may have a circular shape from plan view, and the first wire pattern 122 may include portions that extend lengthwise in one or more horizontal directions (e.g., a first horizontal direction, a second horizontal direction perpendicular to the first horizontal direction, and other horizontal directions).

A barrier layer or a seed layer may be interposed between the first insulating layer 120 and the first wire pattern 122. The barrier layer or the seed layer may be provided to conformally cover side surfaces of the first wire pattern 122 and the first via 124. For example, the barrier layer or the seed layer may be provided to enclose the first wire pattern 122 and the first via 124. A gap between the first wire pattern 122 and the first insulating layer 120 (i.e., a thickness of the barrier layer or the seed layer) may range from 50 Å to 1000 Å. The barrier layer may be formed of or include at least one of titanium (Ti), tantalum (Ta), titanium nitride (TiN), or tantalum nitride (TaN).

The first interconnection layers RL1 may be stacked on the first insulating pattern 110 in a direction perpendicular to a top surface of the first insulating pattern 110. The first interconnection layers RL1 may have substantially the same or similar structure as each other. However, in some embodiments, at least two of the first interconnection layers RL1 may be different from each other in terms of the shapes or layouts of the first wire patterns 122, in consideration of their own functions and positions. In some embodiments, the first interconnection layers RL1 may have the same thickness as each other. The thickness of each of the first interconnection layers RL1 may have a value in a range from 1 μm to 8 μm.

A second insulating pattern 130 may be provided on the uppermost first interconnection layer RL1. The second insulating pattern 130 may be described as a second layer and may cover the first insulating layer 120 of the uppermost first interconnection layer RL1. The second insulating pattern 130 may be formed of or include a photo-imagable polymer (e.g., photo-imagable dielectric (PID)).

Second substrate pads 132 may be provided in the second insulating pattern 130. The second substrate pads 132 may have a T-shaped section. A head portion of the second substrate pad 132 may be provided on a top surface of the second insulating pattern 130, and a tail portion of the second substrate pads 132 may be provided to penetrate the second insulating pattern 130 and may be coupled to (e.g. may contact) the first wire pattern 122 of the uppermost first interconnection layer RL1. The head portion of the second substrate pad 132, which is positioned on the second insulating pattern 130, may be a pad portion of the first redistribution substrate 100, which is used to mount a semiconductor chip 200 thereon. The second substrate pads 132 may be formed of or include at least one of conductive materials. For example, the second substrate pads 132 may be formed of or include copper (Cu).

In some embodiments, the second insulating pattern 130 and the second substrate pads 132 may not be provided. In this case, the first wire pattern 122 of the uppermost one of the first interconnection layers RL1 may be used as the second substrate pads 132 of the first redistribution substrate 100.

The semiconductor chip 200 may be disposed on the first redistribution substrate 100. The semiconductor chip 200 may be mounted on the first redistribution substrate 100 in a flip-chip bonding manner. For example, the semiconductor chip 200 may include chip pads 202, which are electrically connected to integrated circuits in the semiconductor chip 200. Chip connection terminals 204 may be provided between some of the second substrate pads 132, which are located below the semiconductor chip 200, and the chip pads 202. The chip pads 202 may be connected to some of the second substrate pads 132 through the chip connection terminals 204. The chip pads 202 may be formed of or may include a conductive material, such as a metal (e.g., copper (CU)), and the chip connection terminals 204 may be formed of or may include a conductive material, such as a solder, for example, and may be in the form of a bump. In some embodiments, the semiconductor chip 200 may be a logic chip.

Although not shown, a space between the semiconductor chip 200 and the first redistribution substrate 100 may be filled with an under-fill element. The under-fill element may be provided between the semiconductor chip 200 and the first redistribution substrate 100 to enclose the chip connection terminals 204, the chip pads 202, and the second substrate pads 132.

A mold layer 300 may be provided on the first redistribution substrate 100. The mold layer 300 may cover a top surface of the first redistribution substrate 100. The mold layer 300 may be provided on the first redistribution substrate 100 to cover the semiconductor chip 200. Alternatively, a top surface of the mold layer 300 may be formed to expose a top surface of the semiconductor chip 200. The mold layer 300 may be formed of or include an insulating material. For example, the mold layer 300 may be formed of or include an epoxy molding compound (EMC). The mold layer 300 may fill in the spaces between the chip connection terminals 204, or in an embodiment where an under-fill element is included, the mold layer 300 may be formed up to the underfill element, but not fill in the spaces between the chip connection terminals 204.

A second redistribution substrate 400 may be disposed on the mold layer 300. The second redistribution substrate 400 may be placed over the semiconductor chip 200. The second redistribution substrate 400 may be in contact with the top surface of the mold layer 300. For example, the mold layer 300 may be provided to fill a region between the first and second redistribution substrates 100 and 400 and to enclose the semiconductor chip 200 between the first and second redistribution substrates 100 and 400.

The second redistribution substrate 400 may include at least one second interconnection layer RL2. For example, the second redistribution substrate 400 may include one or more second interconnection layers RL2 that consist of all of the interconnection layers of the second redistribution substrate 400. For example, the second interconnection layers RL2 may be disposed on the mold layer 300. The second interconnection layers RL2 may be sequentially stacked on the mold layer 300. For example, the second interconnection layers RL2 may be sequentially stacked and directly adjacent to each other to be sequentially stacked on each other. Hereinafter, a structure of the second interconnection layers RL2 will be described in more detail with reference to one of the second interconnection layers.

The second interconnection layer RL2 may include a second insulating layer 420 and a second wire pattern 422.

The second insulating layer 420 may cover the mold layer 300. Alternatively, the second insulating layer 420 of each of the second interconnection layers RL2 may cover another one of the second interconnection layers RL2 thereunder. The second insulating layer 420 may be formed of or include a photo-imagable polymer (e.g., photo-imagable dielectric (PID)). For example, the photo-imagable polymers may include photo-imagable polyimides, polybenzoxazole (PBO), phenol-based polymers, and benzocyclobutene-based polymers. Alternatively, the second insulating layer 420 may be formed of or include an insulating polymer.

The second wire pattern 422 may be provided in the second insulating layer 420. The second wire pattern 422 may extend horizontally in the second insulating layer 420. For example, the second wire pattern 422 may be a pad or wire portion of the second interconnection layer RL2. For example, the second wire pattern 422 may be an element, which is used for a horizontal redistribution in the second redistribution substrate 400. The second wire pattern 422 may be provided in an upper portion of the second insulating layer 420. A top surface of the second wire pattern 422 may be exposed to the outside of the second insulating layer 420 near the top surface of the second insulating layer 420. The second wire pattern 422 may be formed of or include at least one of conductive materials. For example, the second wire pattern 422 may be formed of or include copper (Cu).

A second via 424 may be provided below the second wire pattern 422. The second via 424 may be used to vertically connect the second wire patterns 422 of vertically adjacent ones of the second interconnection layers RL2 to each other. In addition, the second via 424 may be used to connect the lowermost second wire pattern 422 of the second interconnection layer RL2 to a connection terminal 500, which will be described below. For example, the second via 424 may be provided on a portion of a bottom surface of the second wire pattern 422. A bottom surface of the second via 424 may be exposed to the outside of the second insulating layer 420 near the bottom surface of the second insulating layer 420. The second via 424 may extend from the bottom surface of the second wire pattern 422 and may be coupled to (e.g., may contact) the top surface of the second wire pattern 422 of the second interconnection layer RL2 thereunder. In some embodiments, the second via 424 may extend from the bottom surface of the second wire pattern 422 and may be coupled to (e.g., may contact) a top surface of the connection terminal 500. The second via 424 may be formed of or include at least one conductive material, and may be described as a conductive via. For example, the second via 424 may be formed of or include copper (Cu).

The second wire pattern 422 and the second via 424 may have a damascene structure. For example, an individual second wire pattern 422 and corresponding second via 424 may constitute a single, continuous, integrated object, and in this case, the second wire pattern 422 and the second via 424 may serve as a head portion and a tail portion of the single object, respectively. There may be no interface or grain boundary between the second wire pattern 422 and the second via 424. Here, a horizontal width of the second wire pattern 422, which is connected to the second via 424, may be larger than a width of the second via 424. The second wire pattern 422 and the second via 424 may have the shape of letter 'T'. Although a perspective or plan view is not shown, the second vias 424 may have a circular shape from plan view, and the second wire pattern 422 may include portions that extend lengthwise in one or more horizontal directions (e.g., a first horizontal direction, a second horizontal direction perpendicular to the first horizontal direction, and other horizontal directions).

A barrier layer or a seed layer may be interposed between the second insulating layer 420 and the second wire pattern 422. The barrier layer or the seed layer may be provided to conformally cover side surfaces of the second wire pattern 422 and the second via 424. For example, the barrier layer or the seed layer may be provided to enclose the second wire pattern 422 and the second via 424. A gap between the second wire pattern 422 and the second insulating layer 420 (i.e., a thickness of the barrier layer or the seed layer) may have a value in a range from 50 Å to 1000 Å. The barrier layer may be formed of or include at least one of titanium (Ti), tantalum (Ta), titanium nitride (TiN), or tantalum nitride (TaN).

The second interconnection layers RL2 may be stacked on the mold layer 300 in a direction perpendicular to the top surface of the mold layer 300. The second interconnection layers RL2 may be provided to have substantially the same or similar structure. However, in some embodiments, at least two of the second interconnection layers RL2 may be different from each other in terms of the shapes or layouts of the second wire pattern 422, in consideration of their own functions and positions. In some embodiments, the second interconnection layers RL2 may have the same thickness as each other. For example, the thickness of each of the second interconnection layers RL2 may have a value in a range from 1 μm to 8 μm.

A third insulating pattern 430 may be provided on the uppermost second interconnection layer RL2. The third insulating pattern 430 may cover the second insulating layer 420 of the uppermost second interconnection layer RL2. The third insulating pattern 430 may be formed of or include a photo-imagable polymer (e.g., photo-imagable dielectric (PID)).

Third substrate pads 432 may be provided in the third insulating pattern 430. The third substrate pads 432 may have a T-shaped section. A head portion of the third substrate pad 432 may be provided on a top surface of the third insulating pattern 430, and a tail portion of the third substrate pad 432 may be provided in the third insulating pattern 430 to penetrate the third insulating pattern 430 and may be coupled to (e.g., may contact) the uppermost second wire pattern 422 of the second interconnection layer RL2. The head portion of the third substrate pad 432 disposed on the third insulating pattern 430 may serve as a pad portion of the second redistribution substrate 400, which is used to mount an external device, another package, or another device. The third substrate pads 432 may be formed of or include at least one conductive material. For example, the third substrate pads 432 may be formed of or include copper (Cu).

In some embodiments, the third insulating pattern 430 and the third substrate pads 432 may not be provided. In this case, the second wire pattern 422 of the uppermost second interconnection layer RL2 may serve as the third substrate pads 432 of the second redistribution substrate 400. Alternatively, the third insulating pattern 430 may form the top of the package, such that no pads are exposed at a top of the package.

The first redistribution substrate 100 may have a structure similar to the second redistribution substrate 400. As an example, the first and second redistribution substrates 100 and 400 may include the first interconnection layers RL1, which are sequentially stacked, and the second interconnection layers RL2, which are sequentially stacked, respectively. However, there may be some differences in the detailed structure between the first interconnection layers RL1 and the second interconnection layers RL2, because there are differences between the first and second redistribution substrates 100 and 400 in terms of their technical requirements and layouts thereof. This will be described in more detail below.

The first redistribution substrate 100 may have a thickness that is similar to that of the second redistribution substrate

400. For example, a ratio in thickness between the first redistribution substrate 100 and the second redistribution substrate 400 may have a value in a range from 1:1 to 1.3:1. Here, the ratio in thickness between the first and second redistribution substrates 100 and 400 may mean a ratio of the thickness of the second redistribution substrate 400 to the thickness of the first redistribution substrate 100 or a ratio of the thickness of the first redistribution substrate 100 to the thickness of the second redistribution substrate 400. For example, in some embodiments, the thickness of the first redistribution substrate 100 and the thickness of the second redistribution substrate 400 may be substantially equal to each other. As described herein, the thickness of the second redistribution substrate 400 being substantially equal to or substantially the same as the thickness of the first redistribution substrate 100 refers to a thickness that is the same, within a margin of error due to standard variations in manufacturing processes, or that varies by a small margin so as to minimize or eliminate significant warpage due to the redistribution substrates that would affect operation of the semiconductor package. For example, it may include differences from 0% to 5%, or 0% to 10% in thickness (e.g., thickness ratios from 1:1 to 1:1.05, or from 1:1 to 1.1), or in some cases from 0% to any percent up to 30% in thickness (e.g., a thickness ratio from 1:1 up to 1:1.3).

Due to a difference between amounts of wiring required or used for the first and second redistribution substrates 100 and 400 respectively, the number of the first interconnection layers RL1 of the first redistribution substrate 100 may be different from the number of the second interconnection layers RL2 of the second redistribution substrate 400. For example, the number of the first interconnection layers RL1 of the first redistribution substrate 100 may be greater than the number of the second interconnection layers RL2 of the second redistribution substrate 400, because the first redistribution substrate 100 is electrically connected to both of the semiconductor chip 200 and the second redistribution substrate 400. Here, the number of the first interconnection layers RL1 may be greater than the number of the second interconnection layers RL2 by one, two, or three. Each interconnection layer RL1 or RL2 may have a horizontally-extending wiring line pattern at one vertical level, a set of conductive vias connected to (e.g., either contacting, or integrally formed with) the horizontally-extending wiring line pattern at a second vertical level, and an insulating layer surrounding the horizontally-extending wiring line pattern and the conductive vias. For example, one surface of the horizontally-extending wiring line pattern may be coplanar with a first surface of the insulating layer, and one surface of the conductive vias may be coplanar with a second surface of the insulating layer opposite the first surface. Each first interconnection layer RL1 may have the same number of insulating layers (e.g., one insulating layer) as each second interconnection layer RL2 and may also have a single layer of wire patterns and a single layer of conductive vias. For example, each first interconnection layer RL1 may have the same number of layers for the first wiring pattern 122 as the number of layers for the second wiring pattern 422 of each second interconnection layer RL2.

In one embodiment, since the first and second redistribution substrates 100 and 400 have substantially the same thickness and the number of the first interconnection layers RL1 is larger than the number of the second interconnection layers RL2, a first thickness T1 of each of the first interconnection layers RL1 may be smaller than a second thickness T2 of each of the second interconnection layers RL2. For example, the second thickness T2 of the second interconnection layers RL2 may be 1.1 to 3 times the first thickness T1 of the first interconnection layers RL1.

In the case where the first thickness T1 of the first interconnection layers RL1 is different from the second thickness T2 of the second interconnection layers RL2, a third thickness T3 of the first wire pattern 122 provided in the first interconnection layers RL1 may be different from a fourth thickness T4 of the second wire pattern 422 provided in the second interconnection layers RL2. For example, the third thickness T3 of the first wire pattern 122 may be smaller than the fourth thickness T4 of the second wire pattern 422. In some embodiments, the fourth thickness T4 of the second wire pattern 422 may be 1.1 to 2 times the third thickness T3 of the first wire pattern 122.

Generally, in the case where the first redistribution substrate 100 which is directly connected to an external motherboard or the like, the number of interconnection layers constituting the first redistribution substrate 100 may be greater than the number of interconnection layers constituting the second redistribution substrate 400 that is used as a part of a wiring in the semiconductor package. Here, in the case where the first interconnection layers RL1 of the first redistribution substrate 100 are formed to have the same thickness as that of the second interconnection layers RL2 of the second redistribution substrate 400, a total thickness of the first redistribution substrate 100 may be larger than a total thickness of the second redistribution substrate 400. Accordingly, an amount of an insulating or metallic material (e.g., the first insulating layer 120 or the first wire pattern 122) in the first redistribution substrate 100 may be greater than an amount of an insulating or metallic material (e.g., the second insulating layer 420 or the second wire pattern 422) in the second redistribution substrate 400. Due to heat, which is generated during an operation of the semiconductor package or is supplied during the semiconductor packaging process, a warpage issue may occur in the semiconductor package, and in some cases, the semiconductor package may be broken or damaged.

According to some embodiments of the present inventive concepts, the first redistribution substrate 100, which is provided below the semiconductor chip 200, may have substantially the same thickness as the second redistribution substrate 400, which is provided on the semiconductor chip 200. For example, the ratio of thicknesses may have a value between 1:1 and 1:1.3 in either direction, or in some embodiments, between 1:1 and 1:1.05, or between 1:1 and 1:1.1. In addition, there may be no significant difference between the upper and lower structures, which are provided on and below the semiconductor chip 200, in terms of the amounts of the insulating and metallic materials (e.g., first and second insulating layers 120 and 420 and the first and second wire patterns 122 and 422) provided in the semiconductor package. Thus, the upper and lower structures of the semiconductor package may be similar to each other in their thermal expansion coefficients, and this may make it possible to prevent a temperature change, which occurs when the semiconductor package is manufactured or used, from causing a warpage issue in the semiconductor package. Accordingly, it may be possible to improve structural stability of the semiconductor package.

Referring back to FIG. 1, the first and second redistribution substrates 100 and 400 may be electrically connected to each other. For example, the connection terminal 500 may be provided between the first and second redistribution substrates 100 and 400. In the embodiment of FIG. 1, the semiconductor package may be provided in the form of a fan-out wafer-level package (FO-WLP). For example, the connection terminal 500 may be a through electrode. The connection terminal 500 may be provided to be horizontally spaced apart from the semiconductor chip 200. The connection terminal 500 may be extended from a bottom surface of the second redistribution substrate 400 to the top surface of the first redistribution substrate 100 to vertically penetrate the mold layer 300. In some embodiments, a width of the connection terminal 500 may decrease with increasing distance from the second redistribution substrate 400 or decreasing distance from the first redistribution substrate 100. Alternatively, the width of the connection terminal 500 may be substantially constant, regardless of the distance from the second redistribution substrate 400 or the first redistribution substrate 100. The connection terminals 500 may be coupled to some of the second substrate pads 132 of the first redistribution substrate 100. For example, the connection terminal 500 may be coupled to at least one of the second substrate pads 132, which are arranged beside the semiconductor chip 200. The connection terminal 500 may be coupled to the second via 424 of the lowermost one of the second interconnection layers RL2 of the second redistribution substrate 400. The connection terminal 500 may be electrically connected to the outer terminals 116 or the semiconductor chip 200 through the first redistribution substrate 100. The connection terminal 500 may include a metal pillar. For example, the connection terminal 500 may be formed of or include copper (Cu) or tungsten (W). The connection terminal 500 may have a circular cross-sectional shape, when viewed in a plan view, but may have other shapes as well.

The mold layer 300 may be provided to fill a region between the first and second redistribution substrates 100 and 400, to cover the semiconductor chip 200, and to enclose the connection terminal 500.

Figure 2:
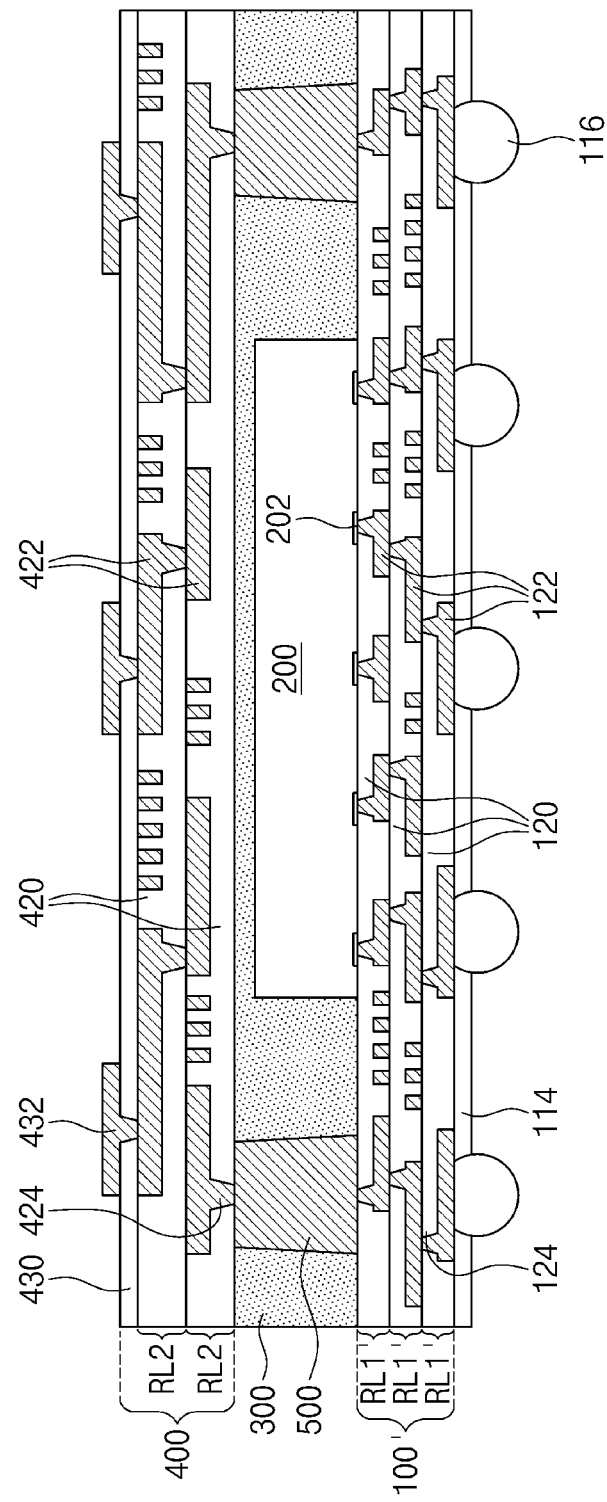
Figure 3:
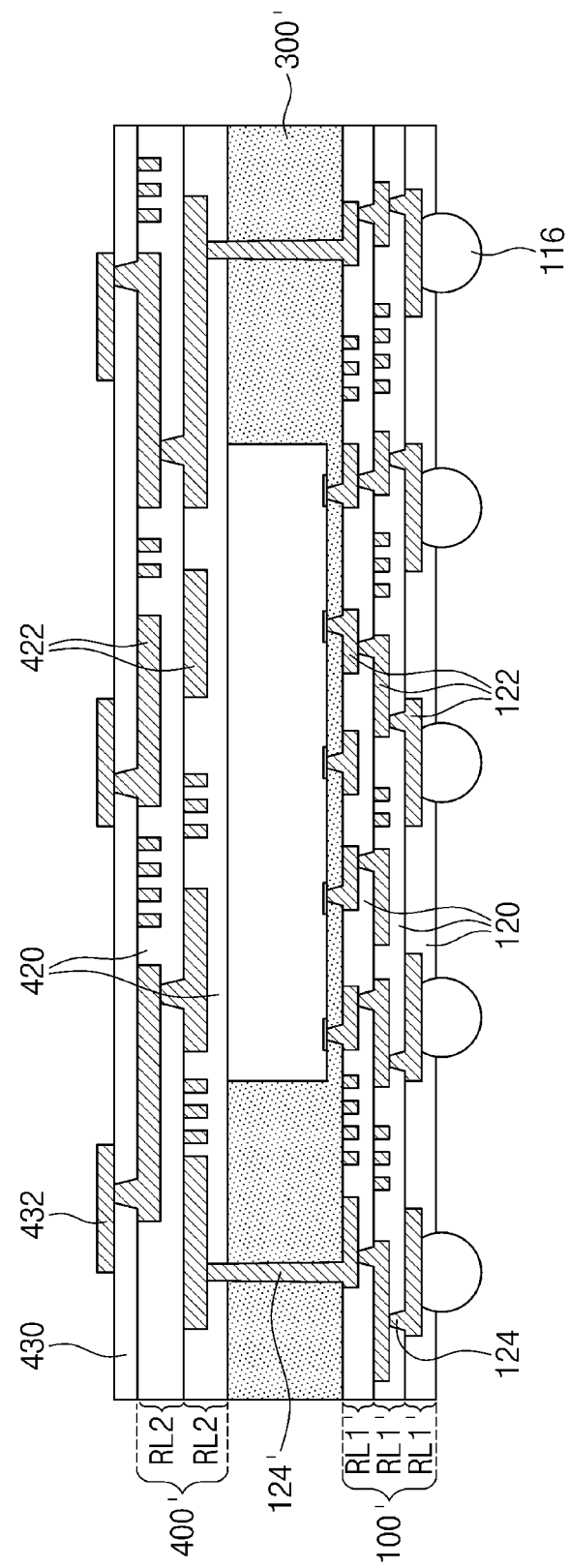

FIGS. 2 and 3 are sectional views of semiconductor packages according to some embodiments of the present inventive concepts.

FIG. 1 illustrates an example in which the semiconductor chip 200 is mounted on the first redistribution substrate 100 in a flip chip bonding manner, but the present inventive concept is not limited to this example.

Referring to FIG. 2, the semiconductor chip 200 may be mounted on a first redistribution substrate 100' in a direct bonding manner. For example, a bottom surface of the semiconductor chip 200 may be in contact with a top surface of the first redistribution substrate 100'. Here, the first redistribution substrate 100' may not have the second insulating pattern 130 (e.g., see FIG. 1) or the second substrate pads 132 (e.g., see FIG. 1). Therefore, the semiconductor chip 200 may be directly coupled to the uppermost first interconnection layer RL1' of the first redistribution substrate 100'. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first wire pattern 122 and the first via 124 of the first interconnection layer RL1' may have a damascene structure.

The first wire pattern 122 may be provided in the first insulating layer 120. The first wire pattern 122 may extend horizontally in the first insulating layer 120. The first wire pattern 122 may be provided in a lower portion of the first insulating layer 120. The bottom surface of the first wire pattern 122 may be exposed to the outside of the first insulating layer 120 near the bottom surface of the first insulating layer 120.

The first via 124 may be provided on the first wire pattern 122. The first via 124 may be used to vertically connect the first wire patterns 122 of vertically adjacent ones of the first interconnection layers RL1' to each other. In addition, the first via 124 may be used to connect the first wire pattern 122 of the uppermost first interconnection layer RL1' to the chip pad 202 of the semiconductor chip 200. For example, the first via 124 may be provided on a portion of the top surface of the first wire pattern 122. A top surface of the first via 124 may be exposed to the outside of the first insulating layer 120 near the top surface of the first insulating layer 120. The first via 124 may extend from the top surface of the first wire pattern 122 and may be coupled to the bottom surface of the first wire pattern 122 of the first interconnection layer RL1' thereon. In some embodiments, the first via 124 may extend from the top surface of the first wire pattern 122 and may be connected to the bottom surface of the chip pad 202.

According to some embodiments of the present inventive concepts, it may be unnecessary to provide a separate element, such as the chip connection terminal 204, which is used to mount the semiconductor chip 200 on the first redistribution substrate 100'. Accordingly, the upper and lower structures, which are placed on and below the semiconductor chip 200, may have a small difference in the amount of metallic material, and this may make it possible to prevent the warpage issues in the semiconductor package caused by a change of temperature.

In addition, there may be no gap between the semiconductor chip 200 and the first redistribution substrate 100'. In this case, it may be possible to reduce a thickness and a size of the semiconductor package.

Referring further to FIG. 2, the first redistribution substrate 100' may not have the first insulating pattern 110 (e.g., see FIG. 1) or the first substrate pads 112 (e.g., see FIG. 1). For example, the first wire pattern 122 in the lowermost first interconnection layer RL1 may be exposed to the outside of the first insulating layer 120 near the bottom surface of the first insulating layer 120. The protection layer 114 may cover the first wire pattern 122 of the lowermost first interconnection layer RL1. The outer terminals 116 may be provided to penetrate the protection layer 114 and may be coupled to the first wire pattern 122 of the lowermost first interconnection layer RL1. In this manner, the first wire pattern 122 of the lowermost first interconnection layer RL1 may play substantially the same role as the first substrate pads 112 described with reference to FIG. 1.

The connection terminal 500 may extend from the bottom surface of the second redistribution substrate 400 to the top surface of the first redistribution substrate 100' to vertically penetrate the mold layer 300. Here, the connection terminal 500 may be in contact with a top surface of the uppermost first interconnection layer RL1'. More specifically, the connection terminal 500 may be in contact with the top surface of the first insulating layer 120 of the uppermost first interconnection layer RL1' and may be coupled to and may contact the first via 124 of the first wire pattern 122, which is exposed to the outside near the top surface of the first insulating layer 120. A width of the connection terminal 500 may increase with increasing distance from the second redistribution substrate 400 or decreasing distance from the first redistribution substrate 100'. Alternatively, the width of the connection terminal 500 may be substantially constant, regardless of the distance from the second redistribution substrate 400 or the first redistribution substrate 100'.

In some embodiments, unlike that shown in FIG. 2, the semiconductor chip 200 may be spaced apart from the first redistribution substrate 100'.

As shown in FIG. 3, the semiconductor chip 200 may be spaced apart from the top surface of the first redistribution substrate 100'. A space between the semiconductor chip 200 and the first redistribution substrate 100' may be filled with the mold layer 300'.

The first wire pattern 122 may be provided in the first insulating layer 120. The first wire pattern 122 may be horizontally extended in the first insulating layer 120. The first wire pattern 122 may be provided in an upper portion of the first insulating layer 120. The top surface of the first wire pattern 122 may be exposed to the outside of the first insulating layer 120 near the top surface of the first insulating layer 120.

The first vias 124 may be provided on the first wire pattern 122. Each first via 124 may be used to vertically connect the first wire patterns 122 of vertically adjacent ones of the first interconnection layers RL1' to each other. In addition, the first vias 124 may be used to connect the first wire patterns 122 of the uppermost first interconnection layer RL1' to the chip pad 202 of the semiconductor chip 200. For example, a first via 124 may be provided on a portion of the top surface of a first wire pattern 122. The first via 124 may extend from the top surface of the first wire pattern 122 to penetrate the first insulating layer 120 of the first interconnection layer RL1' thereon and may be connected to the bottom surface of the first wire pattern 122. In some embodiments, the first via 124 may extend from the top surface of the first wire pattern 122 to penetrate the mold layer 300' and may be connected to a bottom surface of the chip pad 202.

In the embodiment of FIG. 3, the connection terminal 500 (e.g., such as depicted in FIG. 2) may not be provided. A via 124', which is one of the vias 124 of the uppermost first interconnection layer RL1' and is placed beside the semiconductor chip 200, may be provided to penetrate the mold layer 300' and may be coupled to the second redistribution substrate 400, as shown in FIG. 3. Thus, generally speaking, a connection terminal may correspond to the via 124', which is provided in the uppermost first interconnection layer RL1' of the semiconductor package of FIG. 3. In this case, the first wire pattern 122 of the first interconnection layer RL1' may be provided in an upper portion of the first insulating layer 120, and the top surface of the first wire pattern 122 may be exposed to the outside of the first insulating layer 120 near the top surface of the first insulating layer 120. The first via 124 may extend from the top surface of the first wire pattern 122 to penetrate the first insulating layer 120 of the first interconnection layer RL1' thereon and may be connected to the bottom surface of the next first wire pattern 122.

The first redistribution substrate 100' may not have the protection layer 114 (e.g., see FIG. 2). Since the first wire pattern 122 is buried in the upper portion of the first insulating layer 120, the first wire pattern 122 may not be exposed to the outside of the first insulating layer 120 through the bottom surface of the first insulating layer 120. For example, the first insulating layer 120 of the lowermost first interconnection layer RL1 may play substantially the same role as the protection layer 114 described with reference to FIG. 2. The outer terminals 116 may be provided to penetrate the first insulating layer 120 of the lowermost first interconnection layer RL1 and may be coupled to the first wire pattern 122.

The second wire pattern 422 of the second interconnection layer RL2' may be provided in an upper portion of the second insulating layer 420, and the top surface of the second wire pattern 422 may be exposed to the outside of the second insulating layer 420 near the top surface of the second insulating layer 420. For example, vias 124', which are some of the vias 124 of the first interconnection layer RL1', may be provided to penetrate the second insulating layer 420 and may be coupled to the second wire pattern 422. The second via 424 may extend from the top surface of the second wire pattern 422 to penetrate the second insulating layer 420 of the second interconnection layer RL2' thereon and may be connected to the bottom surface of the second wire pattern 422. The third insulating pattern 430 may be provided on the uppermost second interconnection layer RL2', and the second via 424 of the uppermost second interconnection layer RL2 may be provided to penetrate the third insulating pattern 430 and may be coupled to the third substrate pads 432, which are disposed on the third insulating pattern 430.

Unlike the illustrated structure, the semiconductor package may include a connection terminal similar to that disclosed in FIGS. 1 and 2, which is provided at a region laterally spaced apart from the semiconductor chip 200 to vertically penetrate the mold layer 300' and to connect the first and second redistribution substrates 100 and 400 to each other. Or in some cases, in addition to such connection terminals, some of the vias 124 of the uppermost first interconnection layer RL1' may be provided to penetrate the mold layer 300' and may be coupled to the connection terminal.

The semiconductor package may be provided to have the afore-described structure.

Figure 4:
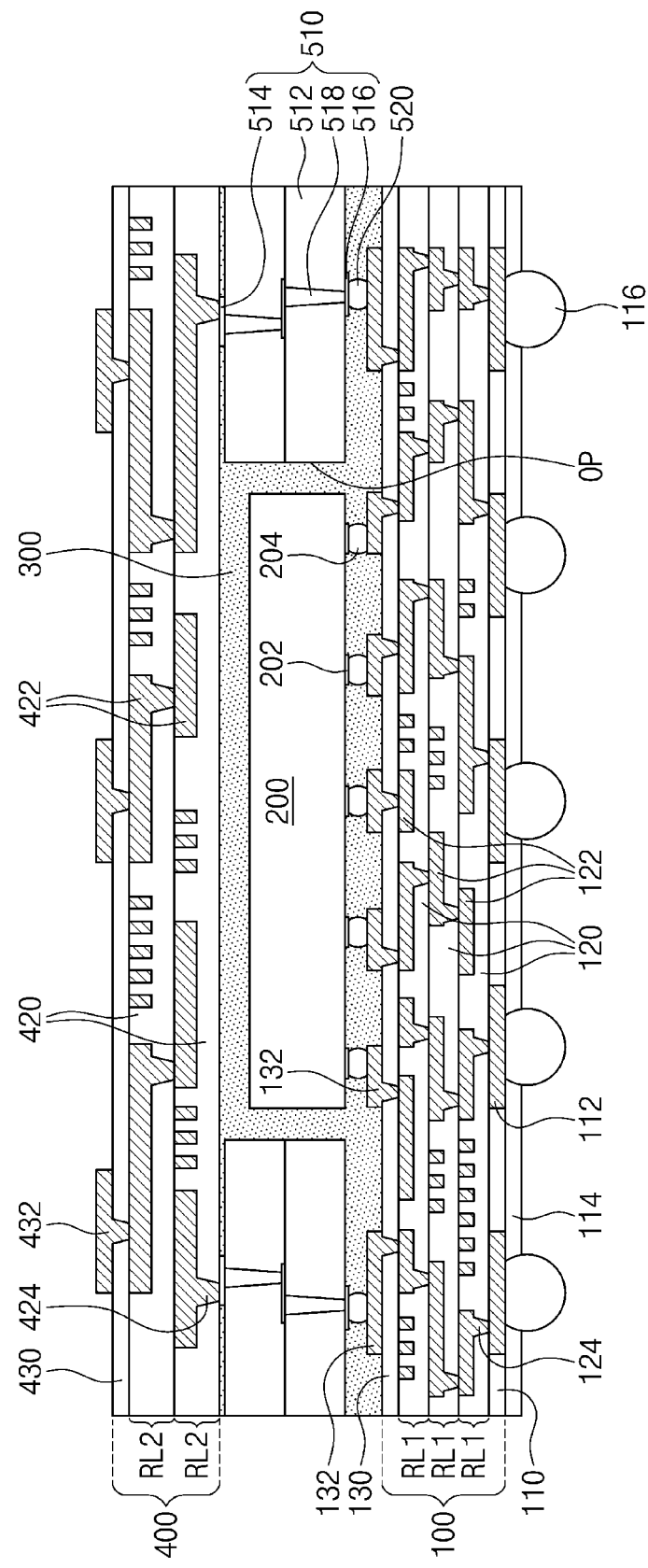

FIG. 4 is a sectional view of a semiconductor package according to some embodiments of the present inventive concepts.

FIG. 1 illustrates the semiconductor package, in which the connection terminal 500 is the through electrode, but the present inventive concept is not limited to this example.

Referring to FIG. 4, the first and second redistribution substrates 100 and 400 may be electrically connected to each other. For example, a connection terminal may be provided between the first and second redistribution substrates 100 and 400. In the embodiment of FIG. 4, the semiconductor package may be provided in the form of a fan-out panel-level package (FO-PLP). For example, the semiconductor package may further include a connection substrate 510.

The connection substrate 510 may have an opening OP, which is formed to penetrate the same. For example, the opening OP may be an empty region, which is formed to penetrate the connection substrate 510 from top to bottom and has an open-hole shape. The bottom surface of the connection substrate 510 may be spaced apart from the top surface of the first redistribution substrate 100.

The connection substrate 510 may include a base layer 512 and a conductive portion, which is a wire pattern provided in the base layer 512. The conductive portion may correspond to the connection terminal 500 of FIG. 1, and may be described as a connection terminal. For example, the conductive portion may be an interconnection structure, which is used to vertically connect the first redistribution substrate 100 to the second redistribution substrate 400. The conductive portion may be located in an outer region of the connection substrate 510, compared with the opening OP. In some embodiments, the conductive portion may include upper pads 514, lower pads 516, and vias 518. The upper pads 514 may be disposed on a top surface of the connection substrate 510. The lower pads 516 may be disposed on a bottom surface of the connection substrate 510. The vias 518 may be provided to penetrate the base layer 512 and to electrically connect the lower pads 516 to the upper pads 514. The base layer 512 may be formed of or include silicon oxide (SiOx). The upper pads 514, the lower pads 516, and the vias 518 may be formed of or include at least one of metallic or conductive materials (e.g., copper (Cu)).

The connection substrate 510 may be mounted on the first redistribution substrate 100. For example, the connection substrate 510 may be coupled to some of the second substrate pads 132 of the first redistribution substrate 100 through connection substrate terminals 520 provided on the lower pads 516. For example, the connection substrate 510 may be coupled to at least one of the second substrate pads 132, which are arranged beside the semiconductor chip 200. Accordingly, the connection substrate 510 may be electrically connected to the semiconductor chip 200 and the outer terminals 116.

The semiconductor chip 200 may be disposed on the first redistribution substrate 100. The semiconductor chip 200 may be disposed in the opening OP of the connection substrate 510. For example, the semiconductor chip 200 may be connected to some of the second substrate pads 132 of the first redistribution substrate 100 through the chip connection terminals 204 provided on the chip pads 202. Such second substrate pads 132 may be located below the semiconductor chip 200.

The mold layer 300 may be provided on the first redistribution substrate 100. The mold layer 300 may cover the semiconductor chip 200, in the opening OP of the connection substrate 510. Here, the mold layer 300 may fill a gap between the connection substrate 510 and the semiconductor chip 200. In addition, the mold layer 300 may fill a space between the semiconductor chip 200 and the first redistribution substrate 100 or a space between the connection substrate 510 and the first redistribution substrate 100. The mold layer 300 may cover the top surface of the connection substrate 510 and may expose the upper pads 514. In some embodiments, the mold layer 300 may not cover the top surface of the connection substrate 510.

The second redistribution substrate 400 may be disposed on the top surface of the mold layer 300 and the top surface of the connection substrate 510. The second redistribution substrate 400 may be coupled to the connection substrate 510. For example, the second via 424 of the lowermost second interconnection layer RL2 of the second redistribution substrate 400 may be coupled to the upper pads 514 of the connection substrate 510.

In some embodiments, similar to the structure described with reference to FIG. 2, the semiconductor chip 200 and the connection substrate 510 may be directly bonded to the first redistribution substrate 100. For example, the bottom surface of the semiconductor chip 200 may be in contact with the top surface of the first redistribution substrate 100, and the bottom surface of the connection substrate 510 may also be in contact with the top surface of the first redistribution substrate 100. In this embodiment, the first redistribution substrate 100 may not have the second insulating pattern 130 (e.g., see FIG. 1) or the second substrate pads 132 (e.g., see FIG. 1). For example, the semiconductor chip 200 and the connection substrate 510 may be coupled to the uppermost first interconnection layer RL1 of the first redistribution substrate 100. The first via 124 of the uppermost first interconnection layer RL1 may be extended from the top surface of the first wire pattern 122 and may be coupled to the bottom surfaces of the chip pads 202 or the lower pad 516 of the connection substrate 510. Thus, in this case, it may be unnecessary to provide a separate element, such as the chip connection terminal 204 or the connection substrate terminal 520, which is used to mount the semiconductor chip 200 and the connection substrate 510 on the first redistribution substrate 100.

Figure 5:
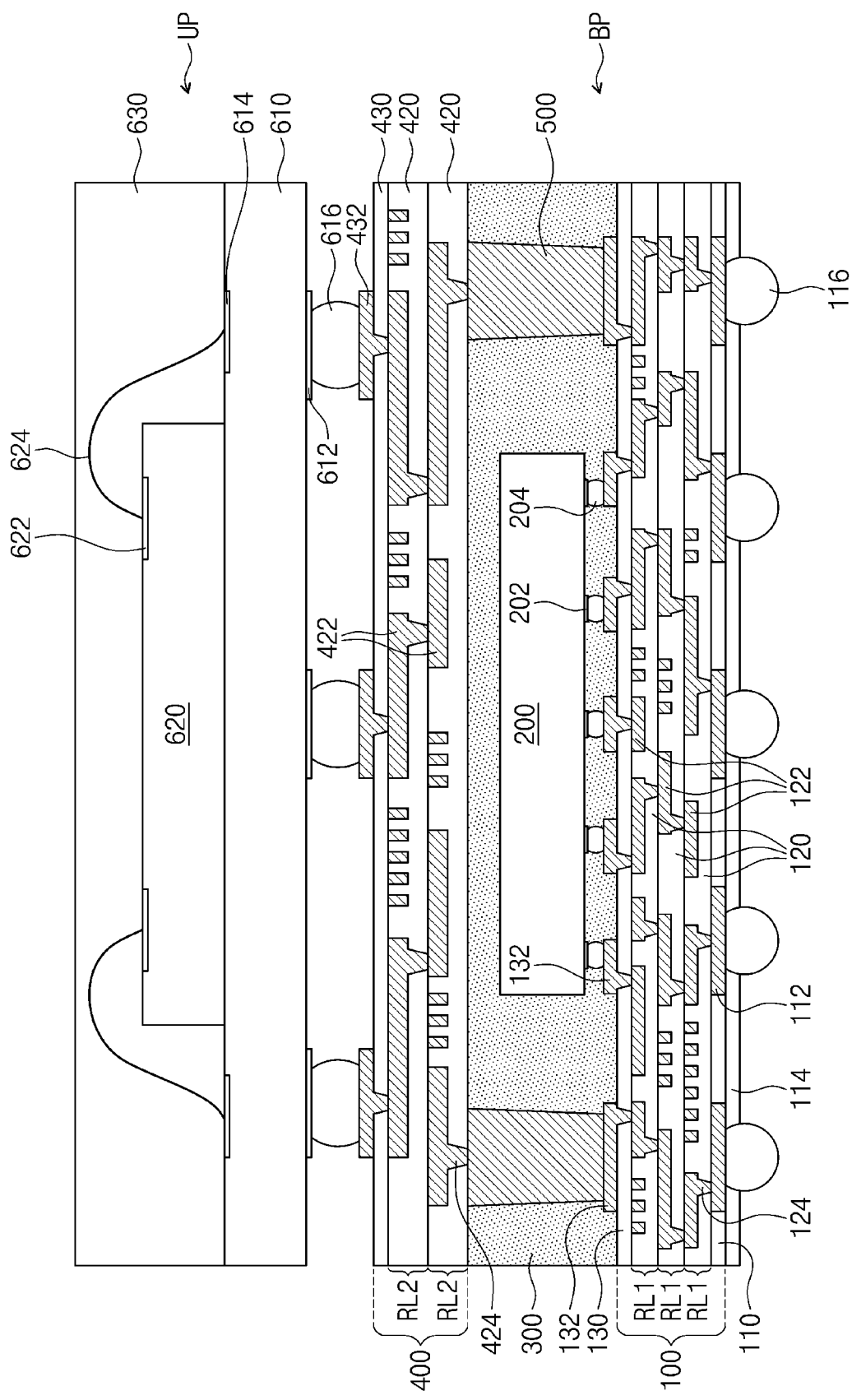

FIG. 5 is a sectional view of a semiconductor package according to some embodiments of the present inventive concepts.

Referring to FIG. 5, the semiconductor package may include a lower package BP and an upper package UP. Accordingly, the semiconductor package may have a package-on-package (PoP) structure, in which the upper package UP is mounted on the lower package BP.

The lower package BP may be configured to have the same or similar features as the semiconductor packages described with reference to any of FIGS. 1 to 4. For example, in one embodiment, the lower package BP may include the first redistribution substrate 100, the semiconductor chip 200 mounted on the first redistribution substrate 100, the mold layer 300 provided on the first redistribution substrate 100 to cover the semiconductor chip 200, the second redistribution substrate 400 on the mold layer 300, and the connection terminal 500, which is provided beside the semiconductor chip 200 to connect the first redistribution substrate 100 to the second redistribution substrate 400.

The upper package UP may be mounted on the lower package BP. The upper package UP may include an upper package substrate 610, an upper semiconductor chip 620, and an upper mold layer 630. The upper package substrate 610 may be a printed circuit board (PCB). Alternatively, the upper package substrate 610 may be a redistribution substrate. First upper substrate pads 612 may be disposed on a bottom surface of the upper package substrate 610. Second upper substrate pads 614 may be disposed on a top surface of the upper package substrate 610.

The upper semiconductor chip 620 may be disposed on the upper package substrate 610. The upper semiconductor chip 620 may include integrated circuits, which include a memory circuit, a logic circuit, or combinations thereof. The upper semiconductor chip 620 may be a semiconductor chip that is of a different kind from the semiconductor chip 200. An upper chip pad 622 of the upper semiconductor chip 620 may be electrically connected to the second upper substrate pads 614 of the upper package substrate 610 through a bonding wire 624. FIG. 5 illustrates an example, in which the upper semiconductor chip 620 is mounted in a wire bonding manner, but the upper semiconductor chip 620 may be mounted in various other manners.

The upper mold layer 630 may be provided on the upper package substrate 610 to cover the upper semiconductor chip 620. The upper mold layer 630 may be formed of or include an insulating polymer (e.g., epoxy-based polymers).

A conductive terminal 616 may be disposed between the lower package BP and the upper package UP. The conductive terminal 616 may be interposed between the third substrate pads 432 of the second redistribution substrate 400 and the first upper substrate pads 612 of the upper package substrate 610 and may be electrically connected to the third substrate pads 432 and the first upper substrate pads 612. Accordingly, the upper package UP may be electrically connected to the semiconductor chip 200 and the outer terminal 116 via the conductive terminal 616, the second redistribution substrate 400, and the first redistribution substrate 100.

Figure 6:
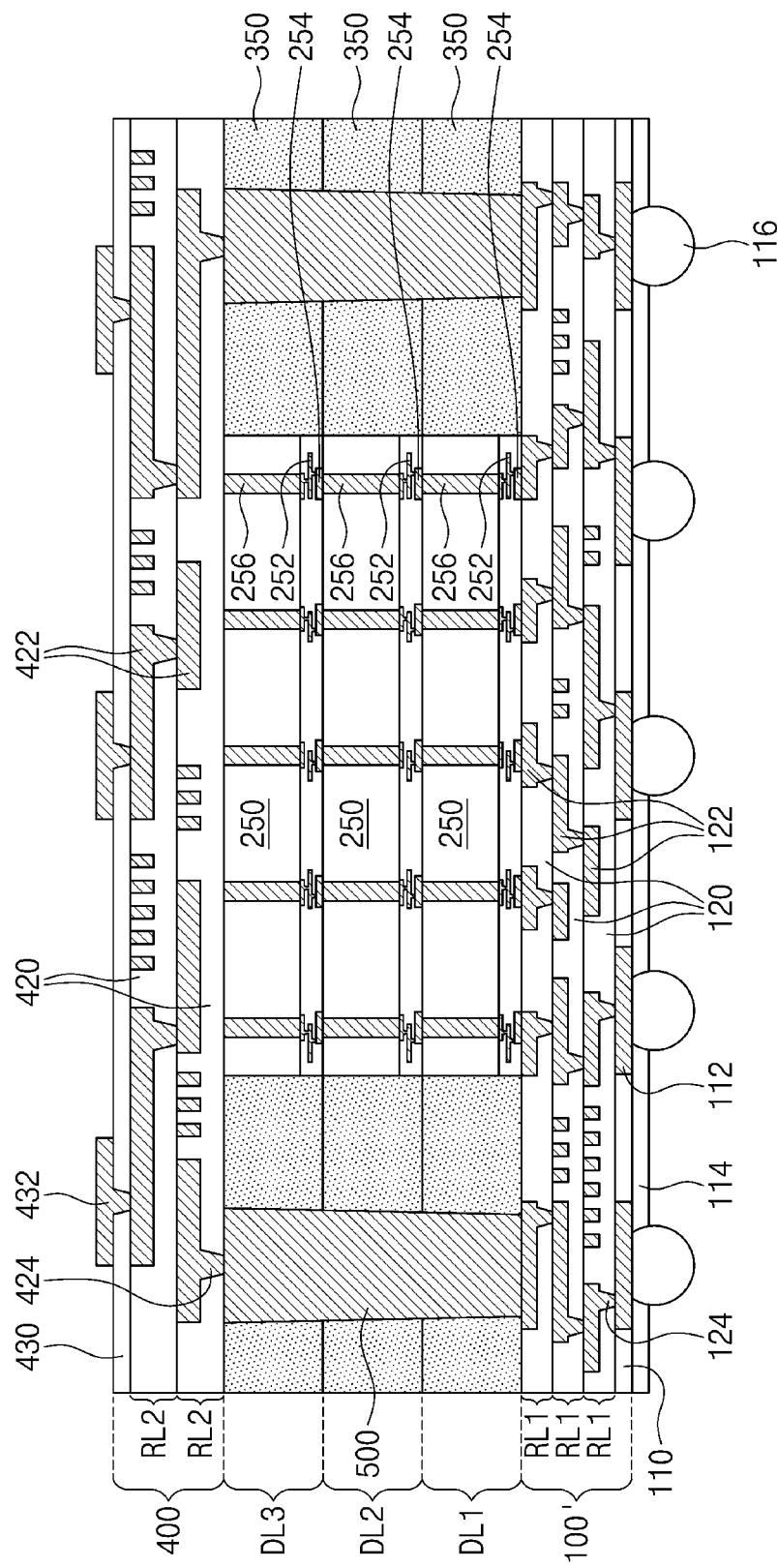

FIG. 6 is a sectional view of a semiconductor package according to some embodiments of the present inventive concepts.

Referring to FIG. 6, the first and second redistribution substrates 100' and 400 may be provided. The first and second redistribution substrates 100' and 400 may be provided to have substantially the same or similar features as described with reference to FIG. 1. However, in the present embodiments, the first redistribution substrate 100' may not have the second insulating pattern 130 (e.g., see FIG. 1) or the second substrate pads 132 (e.g., see FIG. 1). Accordingly, the first wire pattern 122 of the uppermost first interconnection layer RL1 may be exposed to the outside of the first redistribution substrate 100' near the top surface of the first redistribution substrate 100'.

First to third device layers DL1, DL2, and DL3 may be provided between the first and second redistribution substrates 100' and 400. FIG. 6 illustrates the semiconductor package including three device layers, but the present inventive concept is not limited to this example. The first to third device layers DL1, DL2, and DL3 may be sequentially stacked on the first redistribution substrate 100'. Each of the first to third device layers DL1, DL2, and DL3 may include a die 250 and a mold layer 350, which is provided to enclose or surround the die 250. The first to third device layers DL1, DL2, and DL3 may have the same or similar structure as each other, and thus, the structure of the first to third device layers DL1, DL2, and DL3 will be described with reference to the first device layer DL1, for brevity's sake.

The die 250 may have a front surface and a rear surface. In the present specification, the front surface may mean a surface of the die, which is close to an active surface of an integrated device and on which die pads are formed, and the rear surface is a surface of the die opposite to the front surface. For example, the die 250 may have a circuit layer 252 provided on the front surface thereof. Chip pads 254, which are exposed on the front surface of the die 250, may be provided in the circuit layer 252 and may be electrically connected to the integrated circuit of the die 250 through the circuit layer 252. The die 250 may be a memory chip (e.g., one of DRAM, SRAM, MRAM, and FLASH memory chips).

The die 250 may further include through vias 256. The through vias 256 may be provided to vertically penetrate the die 250. Ends of the through vias 256 may be exposed on the rear surface of the die 250. In this case, top surfaces of the through vias 256 may be coplanar with the rear surface of the die 250. Opposite ends of the through vias 256 may extend to the front surface of the die 250 and may be coupled to the circuit layer 252.

The mold layer 350 may be provided to enclose the die 250. The mold layer 350 may cover side surfaces of the die 250. The mold layer 350 may expose the rear surface of the die 250. A top surface of the mold layer 350 may be coplanar with the rear surface of the die 250, and the top surface of the mold layer 350 and the rear surface of the die 250 may be substantially flat. The mold layer 350 may expose the front surface of the die 250. A bottom surface of the mold layer 350 may be coplanar with the front surface of the die 250, and the bottom surface of the mold layer 350 and the front surface of the die 250 may be substantially flat.

The first device layer DL1 may be provided on the first redistribution substrate 100'. Here, the die 250 of the first device layer DL1 may be mounted on the first redistribution substrate 100'. For example, the front surface of the die 250 may be provided to face the first redistribution substrate 100', and the die 250 may be electrically connected to the first redistribution substrate 100'. Here, the front surface of the die 250 may be in contact with the top surface of the first redistribution substrate 100'. For example, the circuit layer 252 of the die 250 of the first device layer DL1 may be in contact with the uppermost first interconnection layer RL1 of the first redistribution substrate 100'.

On a boundary between the first device layer DL1 and the first redistribution substrate 100', the chip pad 254 of the die 250 and the first wire pattern 122 of the uppermost first interconnection layer RL1 may be in contact with each other and may form an intermetal hybrid bonding structure. For example, the chip pad 254 of the die 250 and the first wire pattern 122 of the uppermost first interconnection layer RL1 may have a continuous structure, and there may be no observable or visible interface therebetween.

The mold layer 350 of the first device layer DL1 may be in contact with the top surface of the first redistribution substrate 100'.

The second device layer DL2 may be provided on the first device layer DL1. The die 250 of the second device layer DL2 may be mounted on the die 250 of the first device layer DL1. For example, the second device layer DL2 may be provided such that the front surface of the die 250 thereof faces the die 250 of the first device layer DL1. Here, the front surface of the die 250 of the second device layer DL2 may be in contact with the rear surface of the die 250 of the first device layer DL1.

On a boundary between the second device layer DL2 and the first device layer DL1, the chip pad 254 of the die 250 of the second device layer DL2 and the through vias 256 of the die 250 of the first device layer DL1 may be in contact with each other and may form an intermetal hybrid bonding structure. For example, the chip pad 254 of the die 250 of the second device layer DL2 and the through vias 256 of the die 250 of the first device layer DL1 may have a continuous structure, and there may be no observable or visible interface therebetween.

The mold layer 350 of the second device layer DL2 may be in contact with the top surface of the mold layer 350 of the first device layer DL1.

The third device layer DL3 may be provided on the second device layer DL2. The third device layer DL3 may be disposed and mounted on the second device layer DL2 in substantially the same or similar manner as disposing and mounting the second device layer DL2 on the first device layer DL1. For example, the front surface of the die 250 of the third device layer DL3 may be in contact with the rear surface of the die 250 of the second device layer DL2. On a boundary between the third device layer DL3 and the second device layer DL2, the chip pad 254 of the die 250 of the third device layer DL3 and the through vias 256 of the die 250 of the second device layer DL2 may be in contact with each other and may form an intermetal hybrid bonding structure.

The mold layer 350 of the third device layer DL3 may be in contact with the top surface of the mold layer 350 of the second device layer DL2.

A top surface of the third device layer DL3 may be in contact with the bottom surface of the second redistribution substrate 400. Accordingly, the dies 250 of the first, second, and third device layers DL1, DL2, and DL3 may be vertically stacked between the first and second redistribution substrates 100' and 400. A plurality of mold layers 350 may be provided to fill a space between the first and second redistribution substrates 100' and 400 and to enclose the dies 250, respectively.

The connection terminal 500 may be provided between the first and second redistribution substrates 100' and 400. For example, the connection terminal 500 may be a through electrode. The connection terminal 500 may be laterally spaced apart from the dies 250. The connection terminal 500 may be provided to vertically penetrate the mold layers 350 of the first, second, and third device layers DL1, DL2, and DL3. The connection terminal 500 may be coupled to the first wire pattern 122 of the uppermost first interconnection layer RL1 of the first redistribution substrate 100'. The connection terminal 500 may be coupled to the second wire pattern 422 of the lowermost second interconnection layer RL2 of the second redistribution substrate 400.

FIG. 6 illustrates an example in which the second redistribution substrate 400 and the third device layer DL3 are directly connected to each other, but the present inventive concept is not limited to this example. For example, in one embodiment, a portion of the second via 424 of the lowermost second interconnection layer RL2 may be coupled to the through via 256, which is exposed near the outside of the die 250 near the rear surface of the die 250 of the third device layer DL3.

FIGS. 7 to 11 are sectional views that illustrate a method of manufacturing a semiconductor package, according to some embodiments of the present inventive concepts.

Figure 7:
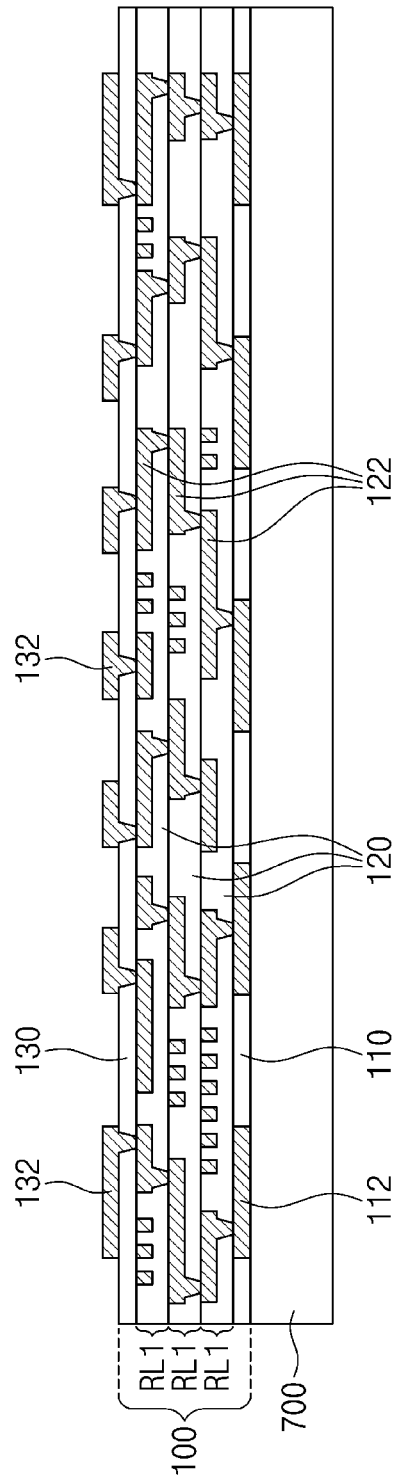
FIGS. 7 to 11 are sectional views that illustrate a method of manufacturing a semiconductor package according to some embodiments of the present inventive concepts.

Referring to FIG. 7, a carrier substrate 700 may be provided. The carrier substrate 700 may be an insulating substrate, which is formed of or includes glass or polymer, or a conductive substrate, which is formed of or includes a metallic material. An adhesive element may be provided on a top surface of the carrier substrate 700. As an example, the adhesive element may include an adhesive tape.

The first insulating pattern 110 may be provided on the carrier substrate 700. The first insulating pattern 110 may be formed of or include an insulating polymer or a photo-imagable polymer (e.g., photo-imagable dielectric (PID)).

The first substrate pads 112 may be formed in the first insulating pattern 110. For example, the formation of the first substrate pads 112 may include patterning the first insulating pattern 110 to form openings for the first substrate pads 112, forming a seed layer in the openings, and performing a plating process, in which the seed layer is used as a seed, to fill the openings with a plating layer.

Alternatively, the formation of the first substrate pads 112 may include sequentially forming a seed layer and a sacrificial layer on the carrier substrate 700, patterning the sacrificial layer to form openings for the first substrate pads 112, and performing a plating process, in which the seed layer in the openings is used as a seed, to fill the openings with a plating layer. Thereafter, the sacrificial layer may be removed, and then, the seed layer may be patterned using the first substrate pads 112 as a mask. Next, the first insulating pattern 110 may be formed on the carrier substrate 700 to enclose the substrate pads 112.

The first insulating layer 120 may be formed on the first insulating pattern 110. The first insulating layer 120 may be formed by a coating process (e.g., a spin coating process or a slit coating process). The first insulating layer 120 may be formed of or include a photo-imagable polymer (e.g., photo-imagable dielectric (PID)).

Openings, which expose the first substrate pads 112, or trenches, which are horizontally extended, may be formed in an upper portion of the first insulating layer 120. The openings may include a portion for a via and a portion for a wire pattern. A conductive layer may be formed on the first insulating layer 120. The conductive layer may be formed to fill the openings and the trenches and to cover the top surface of the first insulating layer 120. In some embodiments, the conductive layer may be formed by forming a seed layer to conformally cover the first insulating layer 120 and performing an electroplating process using the seed layer as a seed. The conductive layer may be formed of or include a metallic material (e.g., copper) and may extended the top surface of the first insulating layer 120.

A planarization process may be performed on the conductive layer to form the first wire pattern 122. The planarization process may be performed using, for example, a chemical mechanical polishing (CMP) process. The planarization process may be performed to expose the top surface of the first insulating layer 120. As a result of the planarization process, each of the first interconnection layers RL1 may be formed to have the first insulating layer 120 and the first wire pattern 122.

In the case where the first redistribution substrate 100 includes a plurality of first interconnection layers RL1, the above process may be repeated to form the first interconnection layers RL1. For example, the first insulating layer 120 may be additionally formed on the lowermost one of the first interconnection layers RL1, an opening may be formed on the first insulating layer 120 to expose the first wire pattern 122 of the lowermost first interconnection layer RL1, a conductive layer may be formed on the first insulating layer 120 to fill the opening, and the planarization process may be performed on the conductive layer.

The second insulating pattern 130 and the second substrate pads 132 may be formed on the uppermost first interconnection layer RL1. The second insulating pattern 130 may be formed by a coating process (e.g., a spin coating process or a slit coating process). The second insulating pattern 130 may be formed of or include a photo-imagable polymer (e.g., photo-imagable dielectric (PID)). For example, the photo-imagable polymers may include photo-imagable polyimides, polybenzoxazole (PBO), phenol-based polymers, and benzocyclobutene-based polymers.

The second insulating pattern 130 may be formed to have openings. For example, a mask pattern may be formed on the second insulating pattern 130, the second insulating pattern 130 may be patterned to form the openings, and then, the mask pattern may be removed.

A barrier layer and a conductive layer may be formed on the second insulating pattern 130 to fill the openings, and then, the second substrate pads 132 may be formed by patterning the barrier layer and the conductive layer.

The first redistribution substrate 100 may be formed by the afore-described method.

Figure 8:
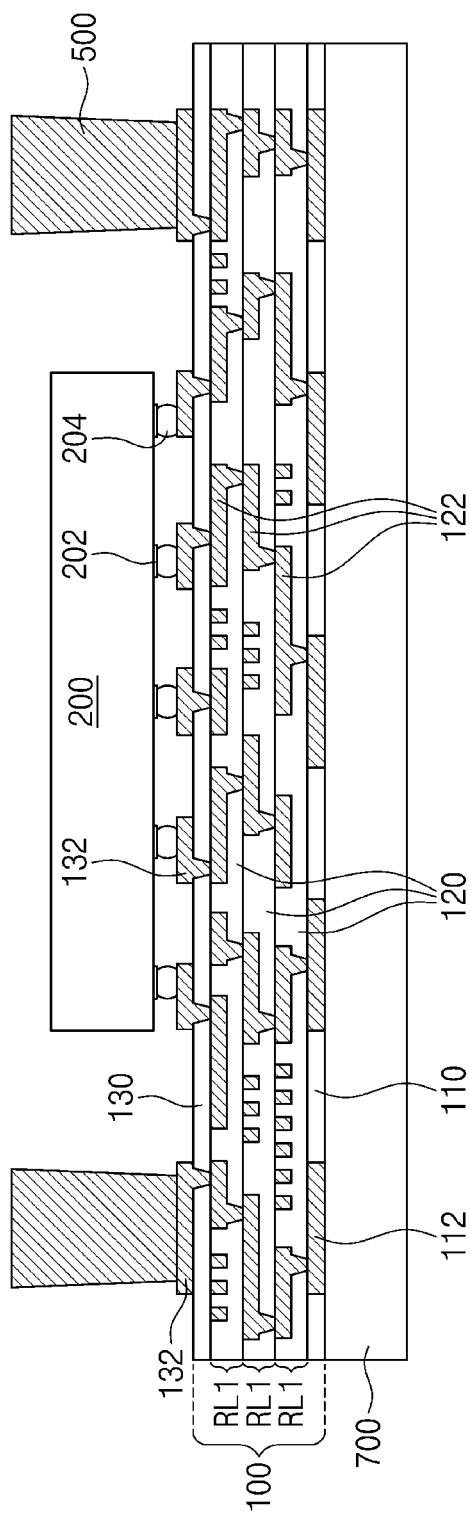

Referring to FIG. 8, the connection terminal 500 may be formed on the first redistribution substrate 100. The connection terminal 500 in the embodiments of FIGS. 7 to 12 may be the through electrode described with reference to FIG. 1. In some embodiments, the connection terminal 500 may be formed by forming a sacrificial layer on the first redistribution substrate 100, forming a via hole to penetrate the sacrificial layer and to expose the second substrate pad 132, and filling the via hole with a conductive material. The sacrificial layer may be removed in a subsequent step.

The semiconductor chip 200 may be mounted on the first redistribution substrate 100. The semiconductor chip 200 may be mounted in a flip chip bonding manner. For example, the chip connection terminals 204 may be provided on the chip pads 202 of the semiconductor chip 200. The semiconductor chip 200 may be aligned such that the chip connection terminals 204 are placed on the second substrate pads 132, and then a reflow process may be performed to connect the chip connection terminals 204 to the second substrate pads 132 and the chip pads 202.

In the case where the semiconductor package is formed in the structure described with reference to FIG. 4, the connection substrate 510 (e.g., see FIG. 4) may be mounted on the first redistribution substrate 100 using the connection substrate terminals 520 (e.g., see FIG. 4). Thereafter, the semiconductor chip 200 may be mounted on the first redistribution substrate 100 such that the semiconductor chip 200 is placed within the opening of the connection substrate 510. Hereinafter, the manufacturing method will be described based on the structure of FIG. 8, for brevity's sake.

Figure 9:
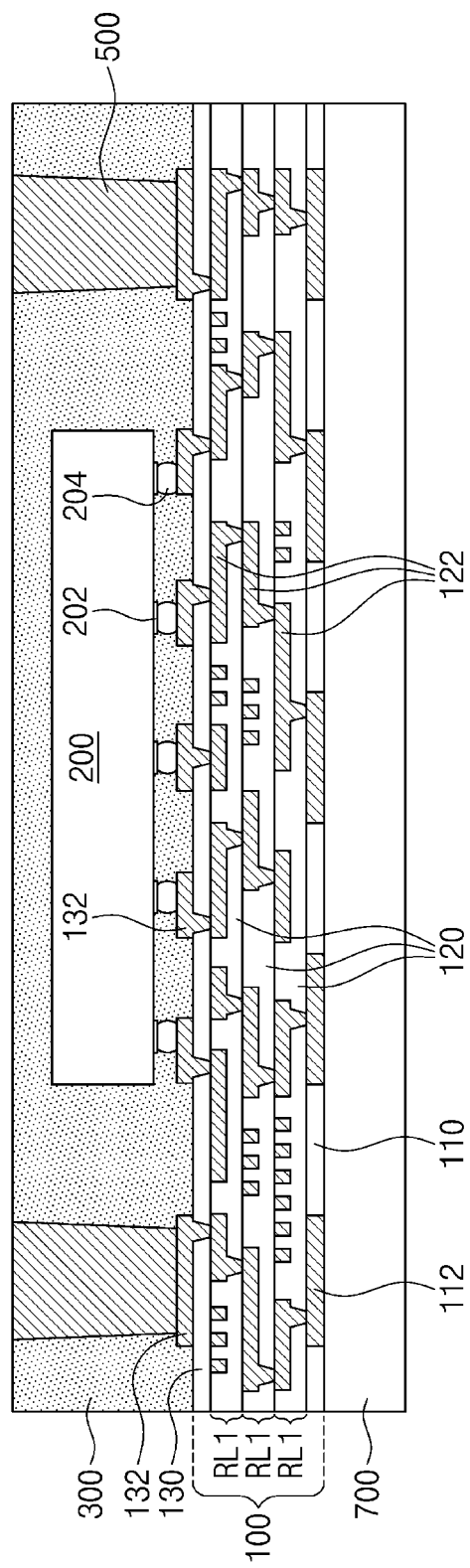

Referring to FIG. 9, the mold layer 300 may be formed on the first redistribution substrate 100. The mold layer 300 may be formed to cover the semiconductor chip 200 and to enclose the connection terminal 500. For example, an insulating layer may be coated on the first redistribution substrate 100 to cover the semiconductor chip 200 and the connection terminal 500 and then may be cured to form the mold layer 300. Thereafter, a planarization process may be performed on the mold layer 300 to expose the top surface of the connection terminal 500.

Unlike that shown in FIGS. 8 and 9, in some embodiments, the semiconductor chip 200 may be mounted on the first redistribution substrate 100, the mold layer 300 may be formed on the first redistribution substrate 100 to cover the semiconductor chip 200, a via hole may be formed in the mold layer 300 to expose the second substrate pad 132, and the connection terminal 500 may be formed by filling the via hole with a conductive material. In this case, a thinning process may be further performed to adjust thicknesses of the mold layer 300 and the connection terminal 500, if necessary.

Figure 10:
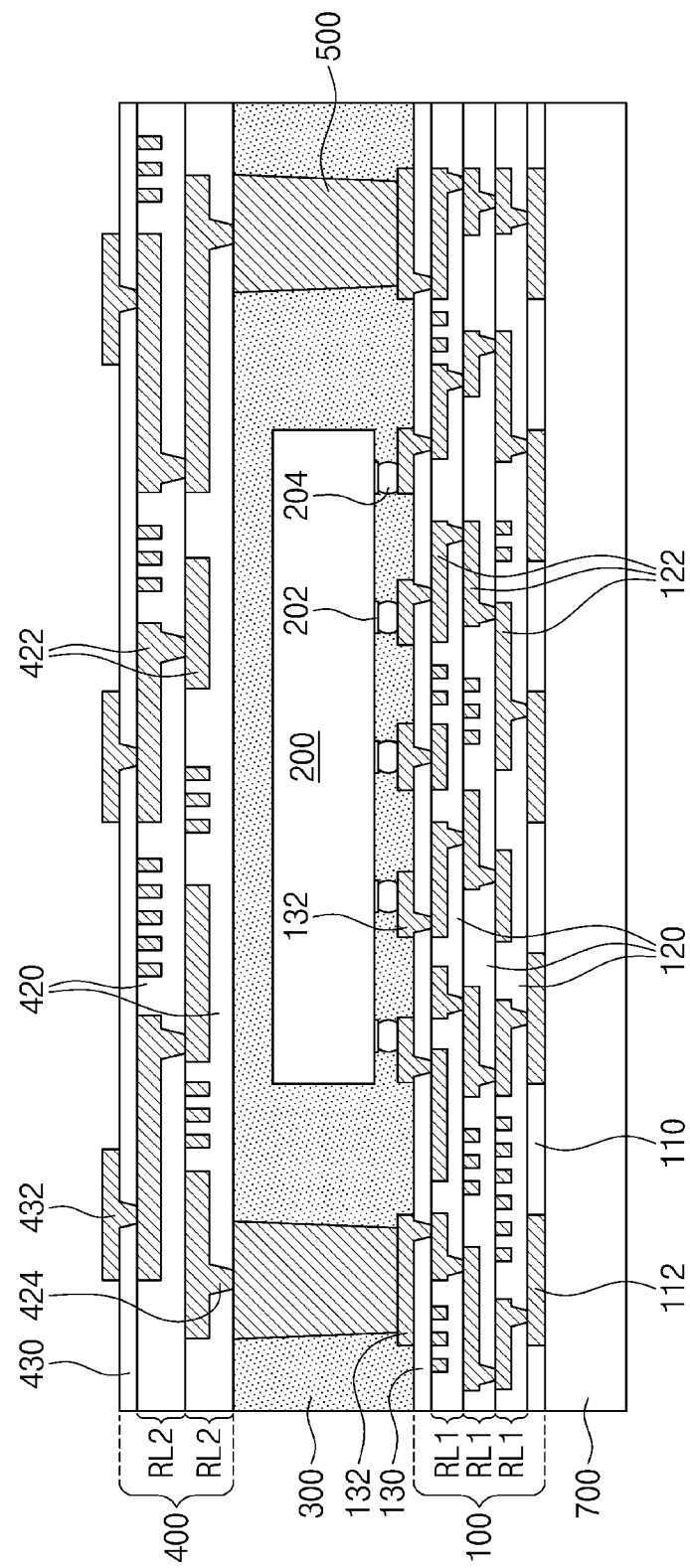

Referring to FIG. 10, the second redistribution substrate 400 may be formed on the mold layer 300. The second redistribution substrate 400 may be formed by a method that is similar to that for the first redistribution substrate 100. For example, the second insulating layer 420 may be formed on the mold layer 300, openings may be formed to penetrate the second insulating layer 420 and to expose the connection terminal 500, and the second wire pattern 422 and the second via 424 may be formed in the openings. The second interconnection layer RL2 may be formed through the afore-described process, and the process may be repeated to form a plurality of stacked second interconnection layers RL2. The third insulating pattern 430 may be formed on the uppermost one of the second interconnection layers RL2, openings may be formed to penetrate the third insulating pattern 430, and the third substrate pads 432, which are coupled to the second interconnection layers RL2 through the openings, may be formed on the third insulating pattern 430. The second redistribution substrate 400 may be formed through the afore-described process.

In some embodiments, the upper package UP (e.g., see FIG. 5) may be mounted on the second redistribution substrate 400. The upper package UP may include the upper package substrate 610 (e.g., see FIG. 5), the upper semiconductor chip 620 (e.g., see FIG. 5), and the upper mold layer 630 (e.g., see FIG. 5). The upper package UP may be mounted on the second redistribution substrate 400 using the conductive terminal 616 (e.g., see FIG. 5). In this case, the semiconductor package may be manufactured to have the same structure as described with reference to FIG. 5.

Figure 11:
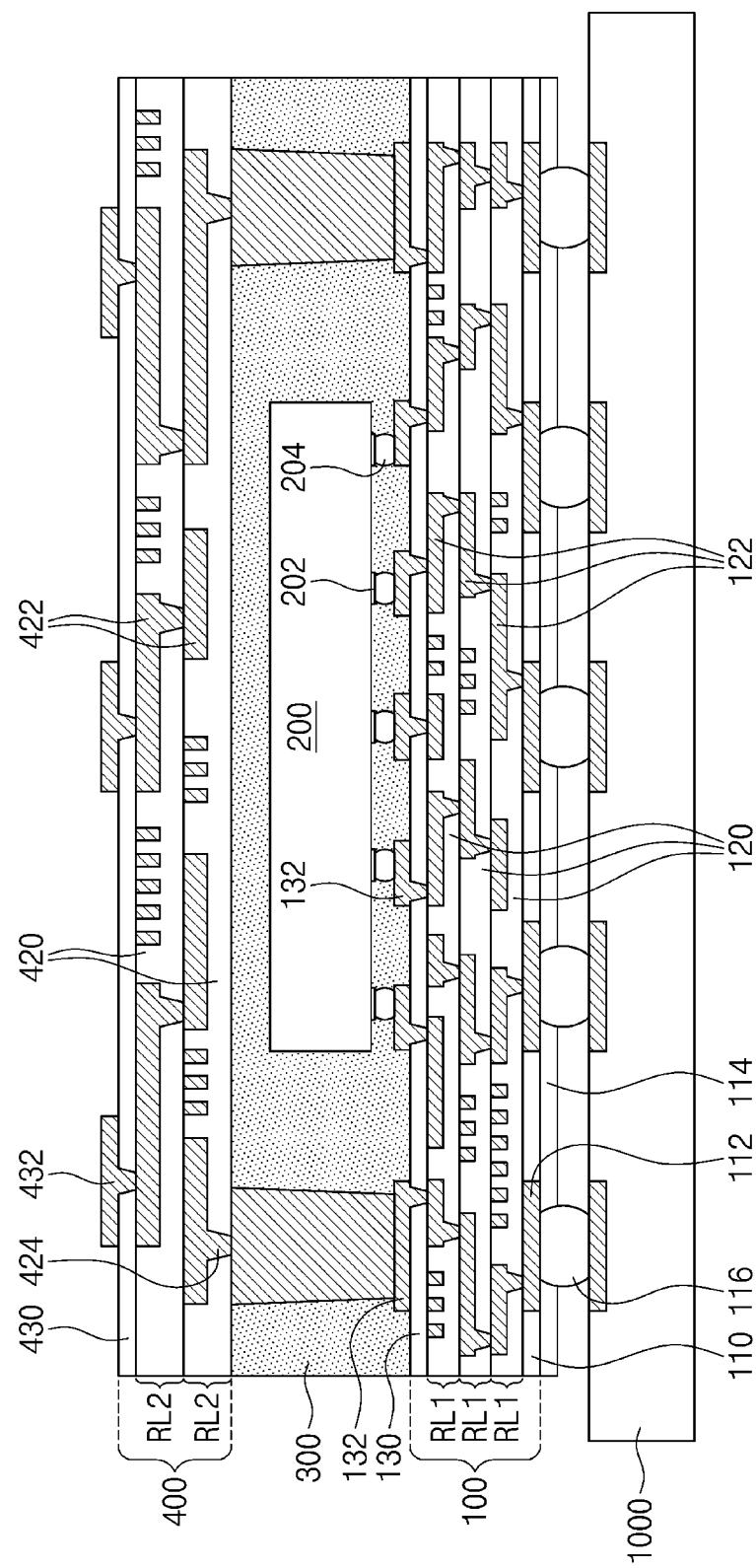

Referring to FIG. 11, a bottom surface of the first redistribution substrate 100 may be exposed by removing the carrier substrate 700. The protection layer 114 may be formed on the bottom surface of the first redistribution substrate 100. The protection layer 114 may be patterned to expose the first substrate pads 112, and then, the outer terminals 116 may be provided on the first substrate pads 112. As a result of the afore-described process, the manufactured semiconductor package may have the structure described with reference to FIG. 1.

Thereafter, the semiconductor package may be mounted on an external electronic device 1000 (e.g., a motherboard), if desired.

According to some embodiments of the present inventive concepts, after the manufacturing process, the upper package UP (e.g., see FIG. 5) may be mounted on the semiconductor package or the semiconductor package may be mounted on the external electronic device 1000. A reflow process, in which a soldering material is melted, may be performed during this process. Upper and lower portions of the semiconductor package, which are located on and below the semiconductor chip 200, may be similar to each other in terms of amounts of insulating and metallic materials (e.g., the insulating layers 120 and 420 and the wire patterns 122 and 422) provided in the semiconductor package. Accordingly, it may be possible to prevent the warpage issue from occurring in the semiconductor package by heat supplied to the semiconductor package after the process of manufacturing the second redistribution substrate 400. For example, it may be possible to prevent the semiconductor package from being broken or damaged by the semiconductor package manufacturing process and thereby to manufacture the semiconductor package with a high yield.

According to some embodiments of the present inventive concepts, a semiconductor package may be provided to have upper and lower structures which are similar to each other in terms of amounts of insulating and metallic materials for insulating layers and wire patterns. Thus, the upper and lower structures of the semiconductor package may be similar to each other in their thermal expansion coefficients, and this may make it possible to prevent a temperature change, which occurs when the semiconductor package is manufactured or used, from causing a warpage issue in the semiconductor package. In other words, it may be possible to improve structural stability of the semiconductor package. In addition, it may be possible to prevent the semiconductor package from being damaged in a process of manufacturing a semiconductor package and thereby to manufacture the semiconductor package with a high yield.

While example embodiments of the present inventive concepts have been particularly shown and described, it will be understood by one of ordinary skill in the art that variations in form and detail may be made therein without departing from the spirit and scope of the attached claims.

What is claimed is:

1. A semiconductor package, comprising:
   a first redistribution substrate including first interconnection layers that are sequentially stacked on each other, wherein the first interconnection layers consist of all of the interconnection layers for the first redistribution substrate;
   a semiconductor chip mounted on the first redistribution substrate;
   a mold layer disposed on the first redistribution substrate and surrounding the semiconductor chip;
   a second redistribution substrate disposed on the mold layer, the second redistribution substrate including second interconnection layers that are sequentially stacked on each other, wherein the second interconnection layers consist of all of the interconnection layers for the second redistribution substrate;
   a connection terminal disposed beside the semiconductor chip to connect the first redistribution substrate and the second redistribution substrate to each other; and
   outer terminals disposed on a bottom surface of the first redistribution substrate, wherein:
each of the first interconnection layers comprises a first insulating layer and a first wire pattern that is provided in the first insulating layer,
each of the second interconnection layers comprises a second insulating layer and a second wire pattern that is provided in the second insulating layer,
a thickness of the first redistribution substrate is substantially equal to a thickness of the second redistribution substrate, and
a first thickness of each of the first interconnection layers is smaller than a second thickness of each of the second interconnection layers.

2. The semiconductor package of claim 1, wherein the number of the first interconnection layers provided in the first redistribution substrate is greater than the number of the second interconnection layers provided in the second redistribution substrate.

3. The semiconductor package of claim 2, wherein a difference between the number of the second interconnection layers and the number of the first interconnection layers is one, two, or three.

4. The semiconductor package of claim 1, wherein the second thickness of each of the second interconnection layers is 1.1 to 3 times the first thickness of each of the first interconnection layers.

5. The semiconductor package of claim 1, wherein each of the first thickness and the second thickness has a value in a range from 1 μm to 8 μm.

6. The semiconductor package of claim 1, wherein:
each first interconnection layer has the same thickness as the other first interconnection layers, and
each second interconnection layer has the same thickness as the other second interconnection layers.

7. The semiconductor package of claim 1, wherein a thickness of each first wire pattern of the first interconnection layers is smaller than a thickness of each second wire pattern of the second interconnection layers.

8. The semiconductor package of claim 7, wherein the thickness of each second wire pattern is 1.1 to 2 times the thickness of each first wire pattern.

9. The semiconductor package of claim 1, wherein:
the first redistribution substrate further comprises a first pad on a top surface thereof, the first pad electrically connected to the first interconnection layers, and
the semiconductor chip is mounted on the first pad of the first redistribution substrate in a flip-chip bonding manner.

10. The semiconductor package of claim 1, wherein:
the mold layer fills a space between the first redistribution substrate and the second redistribution substrate, and
the connection terminal comprises a through electrode vertically penetrating the mold layer.

11. The semiconductor package of claim 1, further comprising a connection substrate disposed between the first redistribution substrate and the second redistribution substrate, the connection substrate having an opening penetrating therein,
wherein the semiconductor chip is disposed in the opening of the connection substrate,
the mold layer fills a space between the connection substrate and the semiconductor chip, in the opening, and
wherein the connection terminal comprises a wire pattern provided in the connection substrate.

12. A semiconductor package, comprising:
a first redistribution substrate including a number of first interconnection layers that are sequentially stacked on each other, the number of first interconnection layers consisting of all of the interconnection layers for the first redistribution substrate;
a second redistribution substrate disposed on the first redistribution substrate, the second redistribution substrate including a number of second interconnection layers that are sequentially stacked on each other, the number of second interconnection layers consisting of all of the interconnection layers for the second redistribution substrate;
a semiconductor chip disposed between the first redistribution substrate and the second redistribution substrate, the semiconductor chip mounted on one of the first redistribution substrate and the second redistribution substrate;
a mold layer provided between the first redistribution substrate and the second redistribution substrate, the mold layer surrounding the semiconductor chip; and
a connection terminal disposed beside the semiconductor chip to connect the first redistribution substrate and the second redistribution substrate to each other,
wherein:
each interconnection layer of the first and second interconnection layers comprises an insulating layer and a wire pattern that is provided in the insulating layer,
a thickness of the first redistribution substrate is substantially equal to a thickness of the second redistribution substrate, and
the number of the first interconnection layers provided in the first redistribution substrate is greater than the number of the second interconnection layers provided in the second redistribution substrate.

13. The semiconductor package of claim 12, wherein a first thickness of each of the first interconnection layers is smaller than a second thickness of each of the second interconnection layers.

14. The semiconductor package of claim 12, wherein a difference between the number of the second interconnection layers and the number of the first interconnection layers is one, two, or three.

15. The semiconductor package of claim 12, wherein a thickness of each wire pattern of the first interconnection layers is smaller than a thickness of each wire pattern of the second interconnection layers.

16. A semiconductor package, comprising:
a first redistribution substrate including a number of first interconnection layers that are sequentially stacked on each other, the number of first interconnection layers consisting of all of the interconnection layers for the first redistribution substrate;
a semiconductor chip mounted on the first redistribution substrate;
a second redistribution substrate disposed on the semiconductor chip, the second redistribution substrate including a number of second interconnection layers that are sequentially stacked on each other, the number of second interconnection layers consisting of all of the interconnection layers for the second redistribution substrate; and
a connection terminal disposed beside the semiconductor chip to connect the first redistribution substrate and the second redistribution substrate to each other,
wherein:
a ratio of a thickness of the first redistribution substrate to a thickness of the second redistribution substrate has a value in a range from 1:1 to 1.3:1, the number of the first interconnection layers provided in the first redistribution substrate is greater than the number of the second interconnection layers provided in the second redistribution substrate, and a first thickness of each of the first interconnection layers is smaller than a second thickness of each of the second interconnection layers.

17. The semiconductor package of claim 16, wherein the thickness of the first redistribution substrate is substantially equal to the thickness of the second redistribution substrate.

18. The semiconductor package of claim 16, wherein:

each of the first interconnection layers comprises a first insulating layer and a first wire pattern that is provided in the first insulating layer, and each of the second interconnection layers comprises a second insulating layer and a second wire pattern that is provided in the second insulating layer.

19. The semiconductor package of claim 18, wherein a thickness of each first wire pattern is smaller than a thickness of each second wire pattern.

* * * * *